US008735906B2

(12) United States Patent
Nakano

(10) Patent No.: US 8,735,906 B2
(45) Date of Patent: *May 27, 2014

(54) SEMICONDUCTOR DEVICE AND METHOD OF MANUFACTURING SEMICONDUCTOR DEVICE

(75) Inventor: Yuki Nakano, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/259,344

(22) PCT Filed: Apr. 5, 2010

(86) PCT No.: PCT/JP2010/056180
§ 371 (c)(1),
(2), (4) Date: Sep. 23, 2011

(87) PCT Pub. No.: WO2010/119789
PCT Pub. Date: Oct. 21, 2010

(65) Prior Publication Data
US 2012/0049202 A1 Mar. 1, 2012

(30) Foreign Application Priority Data

Apr. 13, 2009 (JP) .................................. 2009-097336

(51) Int. Cl.
H01L 29/15 (2006.01)
(52) U.S. Cl.
USPC ............. 257/77; 257/301; 257/139; 257/328; 257/330; 257/333; 438/99; 438/591; 438/440; 438/424

(58) Field of Classification Search
CPC ..................... H01L 29/7813; H01L 29/42368; H01L 29/66734; H01L 29/4236; H01L 29/66727; H01L 29/66719; H01L 29/7802; H01L 29/1608; H01L 29/66712; H01L 29/66348; H01L 29/66666; H01L 21/823487; H01L 29/732
USPC ................... 257/77, 301, 139, 328, 330, 333; 438/99, 591, 440, 424
See application file for complete search history.

(56) References Cited

U.S. PATENT DOCUMENTS 5,424,231 A * 6/1995 Yang .............................. 438/270
6,020,600 A * 2/2000 Miyajima et al. ............... 257/76
(Continued)

FOREIGN PATENT DOCUMENTS

JP 10-098188 A 4/1998
JP 2000-312003 A 11/2000
(Continued)

Primary Examiner — Fernando L Toledo
Assistant Examiner — Mohammed Shamsuzzaman
(74) Attorney, Agent, or Firm — Rabin & Berdo, P.C.

(57) ABSTRACT

The semiconductor device according to the present invention includes a semiconductor layer of a first conductivity type made of SiC, a body region of a second conductivity type formed on a surface layer portion of the semiconductor layer, a gate trench dug down from a surface of the semiconductor layer with a bottom surface formed on a portion of the semiconductor layer under the body region, source regions of the first conductivity type formed on a surface layer portion of the body region adjacently to side surfaces of the gate trench, a gate insulating film formed on the bottom surface and the side surfaces of the gate trench so that the thickness of a portion on the bottom surface is greater than the thickness of portions on the side surfaces, a gate electrode embedded in the gate trench through the gate insulating film, and an implantation layer formed on a portion of the semiconductor layer extending from the bottom surface of the gate trench to an intermediate portion of the semiconductor layer in the thickness direction by implantation of a second conductivity type impurity.

8 Claims, 42 Drawing Sheets

(56) References Cited

U.S. PATENT DOCUMENTS

| | | | |
|---|---|---|---|
| 6,063,694 A * | 5/2000 | Togo | 438/440 |
| 6,228,720 B1 | 5/2001 | Kitabatake et al. | |
| 6,262,439 B1 * | 7/2001 | Takeuchi et al. | 257/77 |
| 6,342,709 B1 * | 1/2002 | Sugawara et al. | 257/139 |
| 6,388,286 B1 * | 5/2002 | Baliga | 257/330 |
| 6,534,367 B2 * | 3/2003 | Peake et al. | 438/270 |
| 7,397,082 B2 * | 7/2008 | Takemori et al. | 257/329 |
| 7,465,986 B2 * | 12/2008 | Girdhar et al. | 257/330 |
| 7,800,187 B2 * | 9/2010 | Matsuura | 257/409 |
| 7,825,449 B2 * | 11/2010 | Suzuki et al. | 257/301 |
| 7,855,384 B2 * | 12/2010 | Yamamoto et al. | 257/77 |
| 8,044,434 B2 * | 10/2011 | Ohta et al. | 257/194 |
| 8,188,484 B2 * | 5/2012 | Nakano | 257/77 |
| 8,330,167 B2 * | 12/2012 | Takehiko et al. | 257/76 |
| 8,462,249 B2 * | 6/2013 | Shinohara | 348/308 |
| 2001/0023961 A1 * | 9/2001 | Hshieh et al. | 257/330 |
| 2001/0053561 A1 * | 12/2001 | Kitabatake et al. | 438/99 |
| 2002/0153558 A1 * | 10/2002 | Takemori et al. | 257/330 |
| 2004/0056302 A1 * | 3/2004 | Grebs et al. | 257/328 |
| 2004/0217358 A1 * | 11/2004 | Kaneko | 257/77 |
| 2004/0222459 A1 * | 11/2004 | Yoshimochi | 257/330 |
| 2005/0077569 A1 * | 4/2005 | Yamashita et al. | 257/328 |
| 2005/0167742 A1 * | 8/2005 | Challa et al. | 257/328 |
| 2006/0060916 A1 * | 3/2006 | Girdhar et al. | 257/330 |
| 2007/0026632 A1 * | 2/2007 | Yamamoto | 438/424 |
| 2007/0138545 A1 * | 6/2007 | Lin et al. | 257/330 |
| 2008/0296647 A1 * | 12/2008 | Tatsumi | 257/298 |
| 2009/0072306 A1 * | 3/2009 | Izumi | 257/333 |
| 2009/0078995 A1 * | 3/2009 | Nakagawa et al. | 257/330 |
| 2009/0114923 A1 * | 5/2009 | Iwamuro | 257/77 |
| 2009/0200559 A1 * | 8/2009 | Suzuki et al. | 257/77 |
| 2010/0193796 A1 * | 8/2010 | Nakano | 257/66 |
| 2010/0193799 A1 * | 8/2010 | Nakano et al. | 257/77 |
| 2011/0018005 A1 * | 1/2011 | Nakano | 257/77 |
| 2012/0025874 A1 * | 2/2012 | Saikaku et al. | 327/109 |
| 2012/0052675 A1 * | 3/2012 | Numazawa et al. | 438/591 |
| 2012/0112273 A1 * | 5/2012 | Aoki et al. | 257/334 |
| 2012/0126249 A1 * | 5/2012 | Nakano | 257/77 |
| 2012/0132926 A1 * | 5/2012 | Nakano et al. | 257/77 |
| 2012/0146137 A1 * | 6/2012 | Izumi | 257/333 |
| 2012/0205670 A1 * | 8/2012 | Kudou et al. | 257/77 |
| 2012/0241854 A1 * | 9/2012 | Ohta et al. | 257/331 |
| 2012/0248461 A1 * | 10/2012 | Masuda et al. | 257/77 |
| 2012/0261714 A1 * | 10/2012 | Taketani et al. | 257/139 |
| 2012/0261748 A1 * | 10/2012 | Lee et al. | 257/330 |
| 2012/0292693 A1 * | 11/2012 | Lee et al. | 257/330 |
| 2012/0306007 A1 * | 12/2012 | Yanagisawa | 257/330 |
| 2012/0326207 A1 * | 12/2012 | Yoshimochi | 257/139 |
| 2013/0341643 A1 * | 12/2013 | Kudou et al. | 257/77 |
| 2014/0014972 A1 * | 1/2014 | Nakano et al. | 257/77 |

FOREIGN PATENT DOCUMENTS

| | | |
|---|---|---|
| JP | 2006-066438 A | 3/2006 |
| JP | 2007-165657 A | 6/2007 |
| JP | 2008-294210 A | 12/2008 |

* cited by examiner

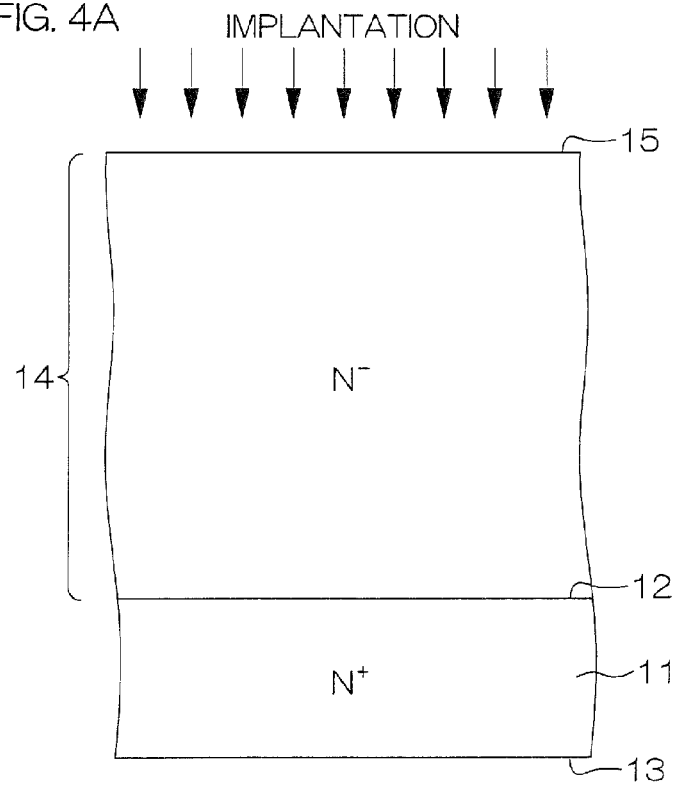
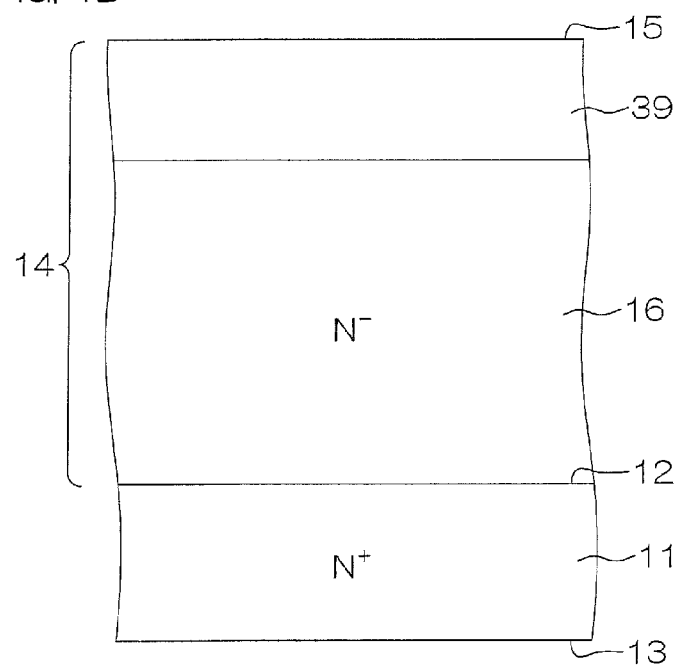

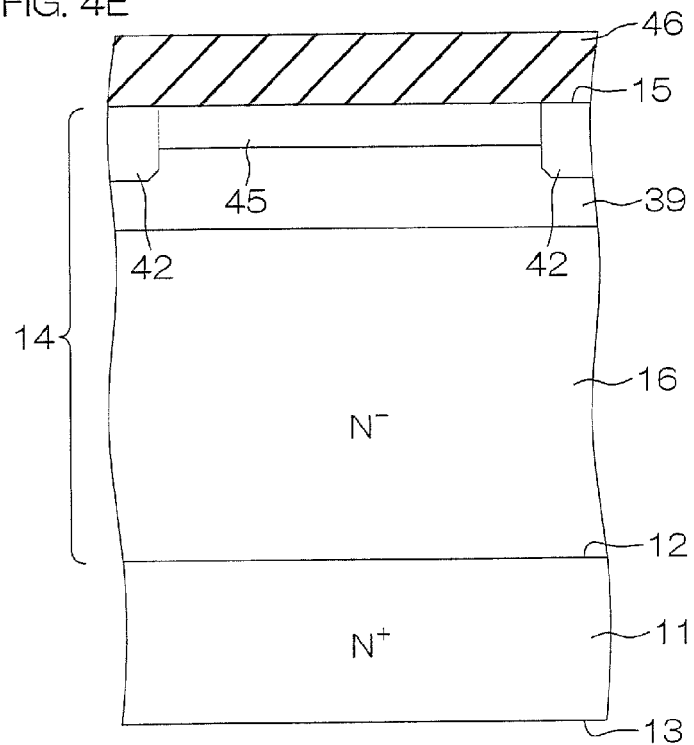
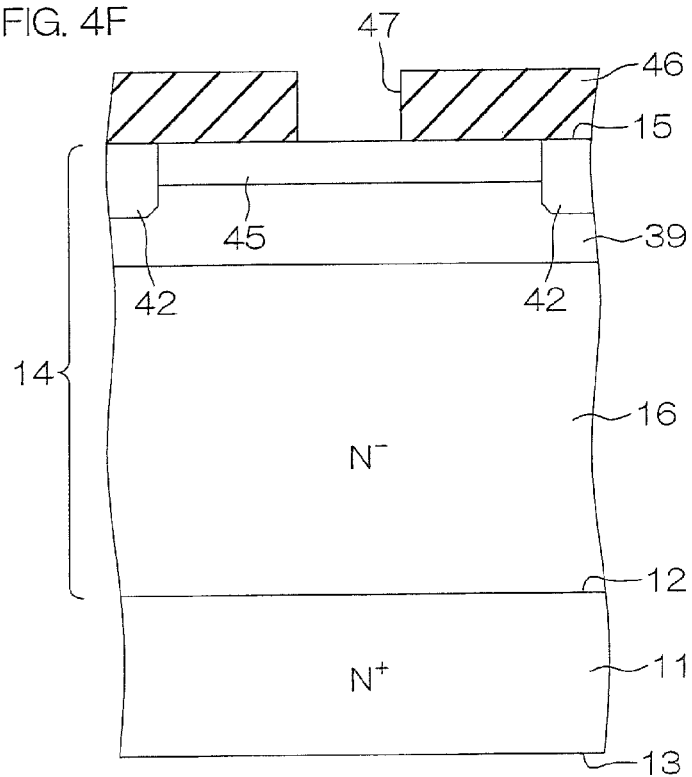

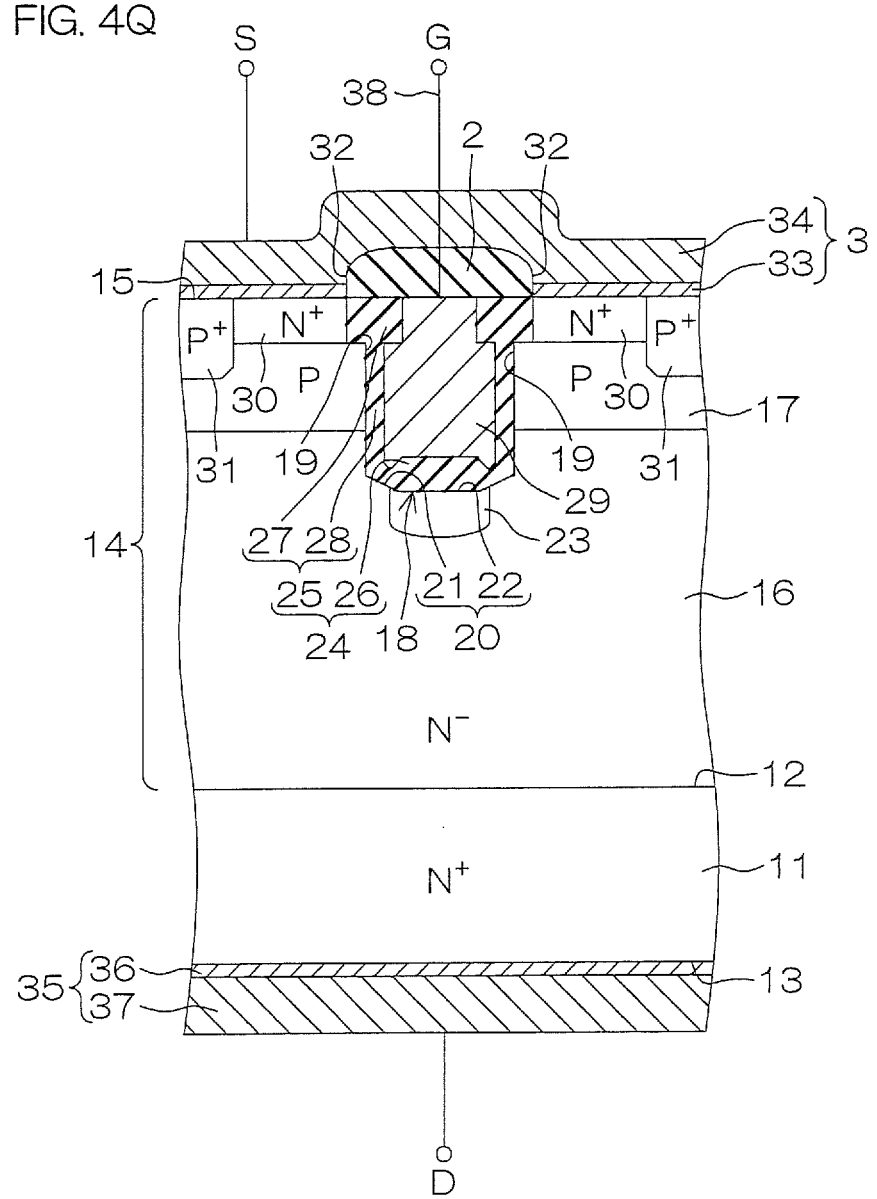

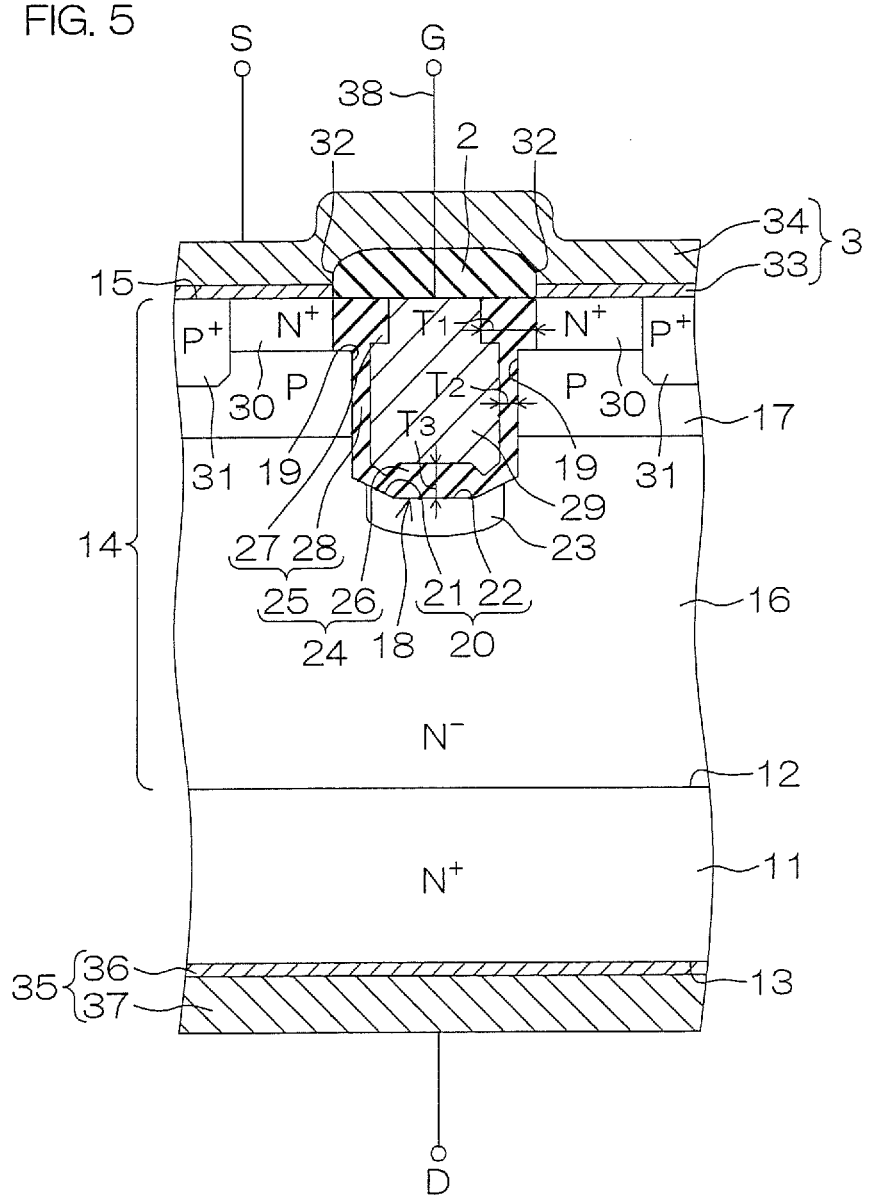

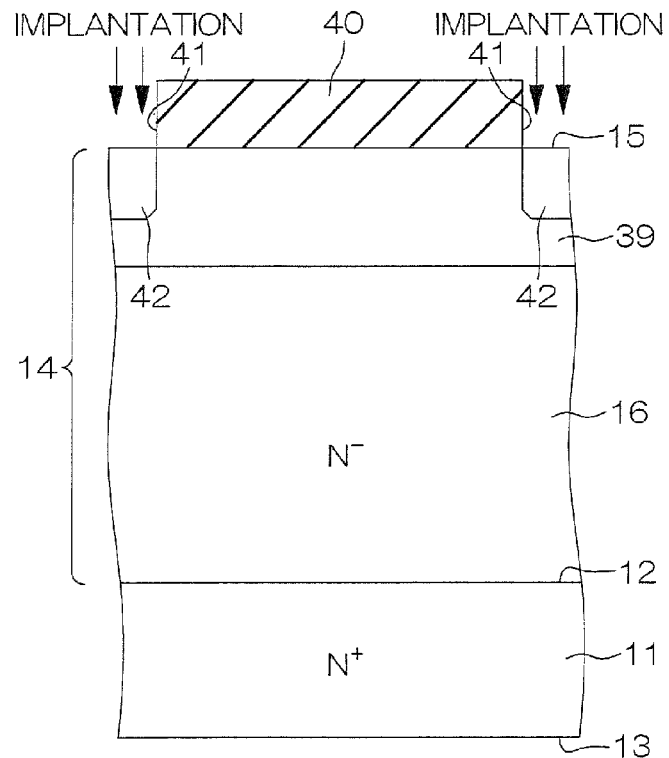
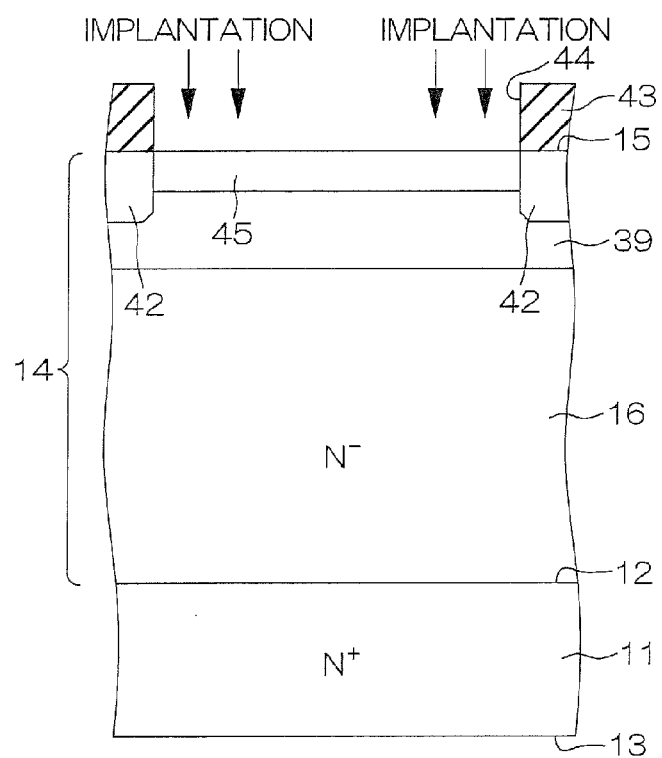

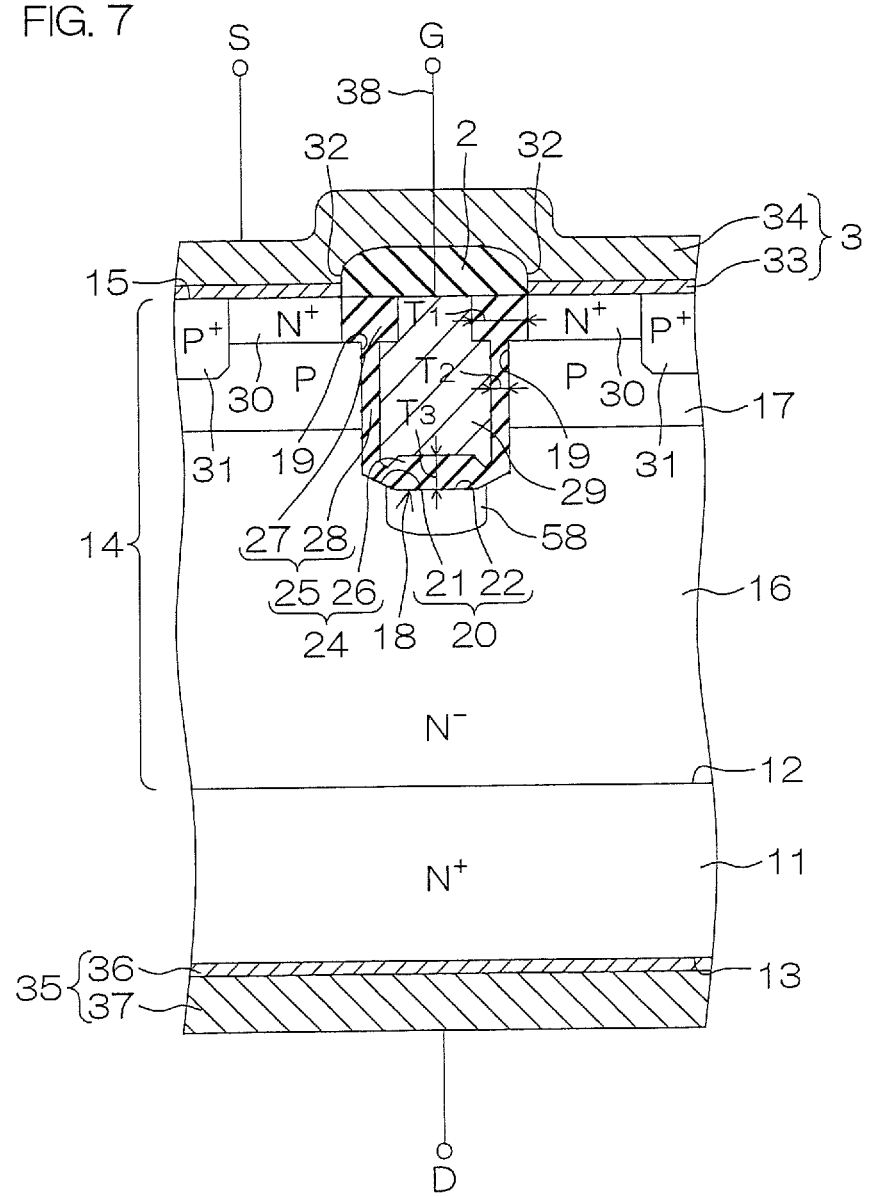

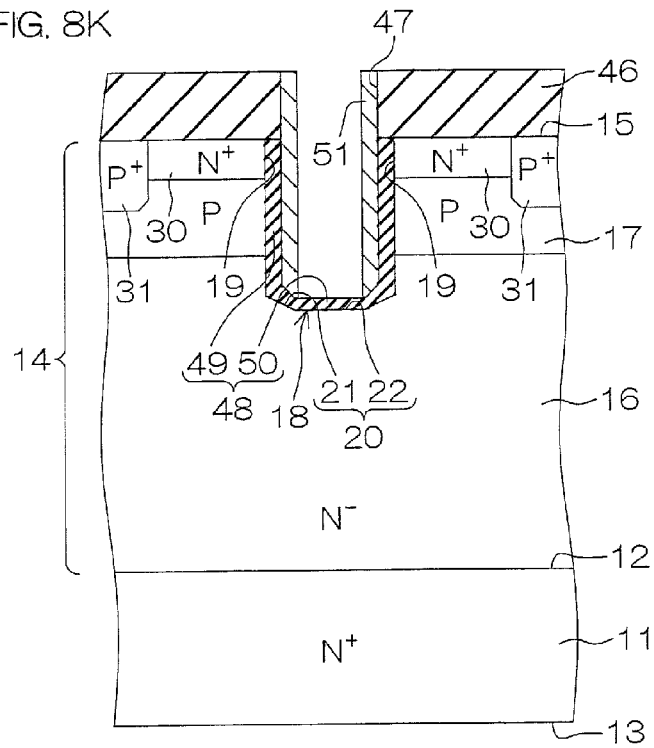
FIG. 8K
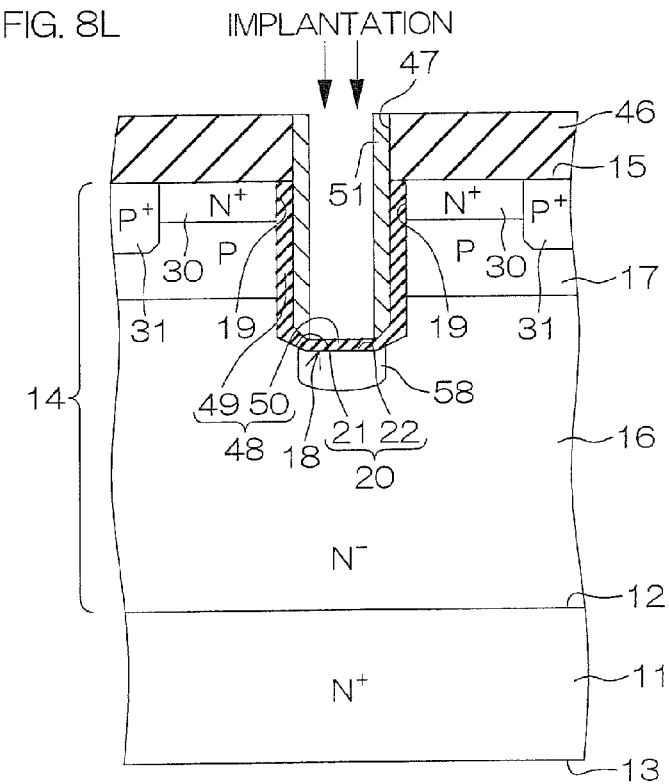
FIG. 8L    IMPLANTATION

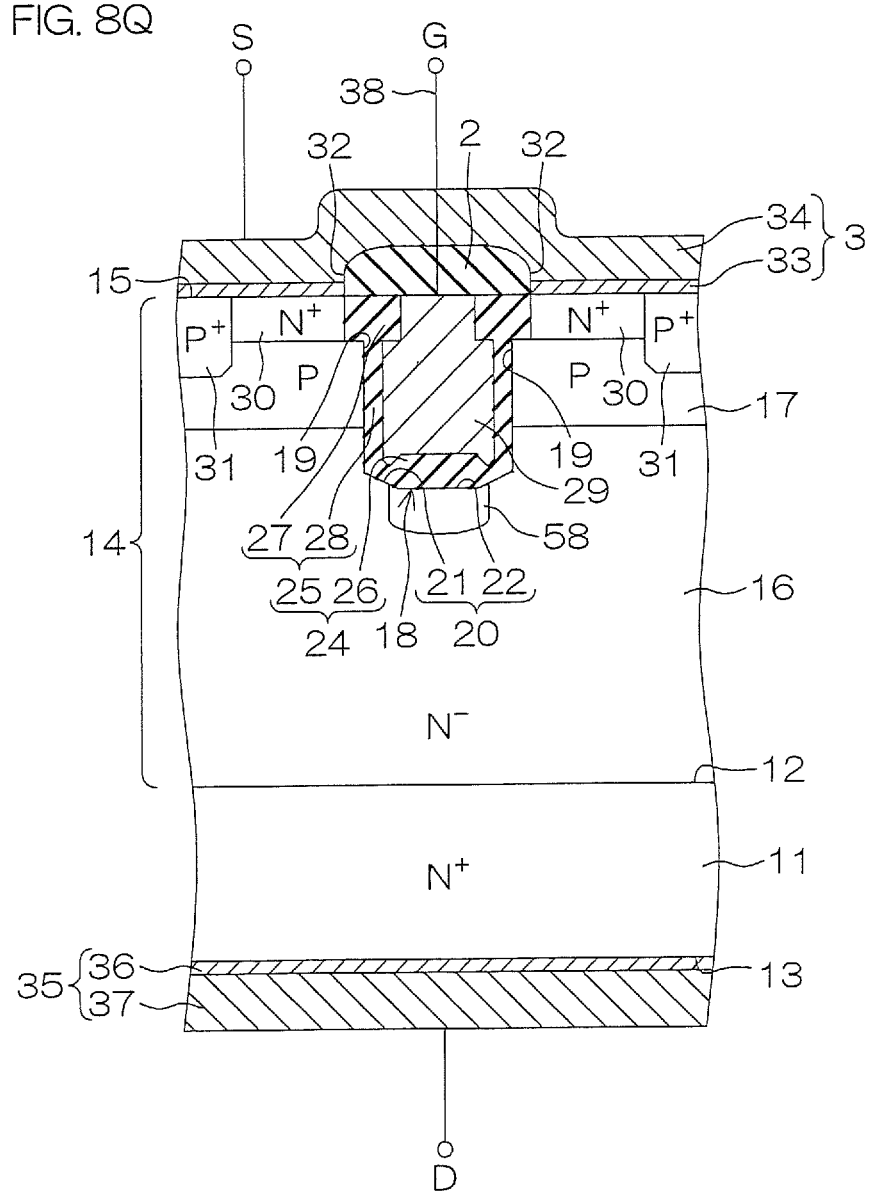

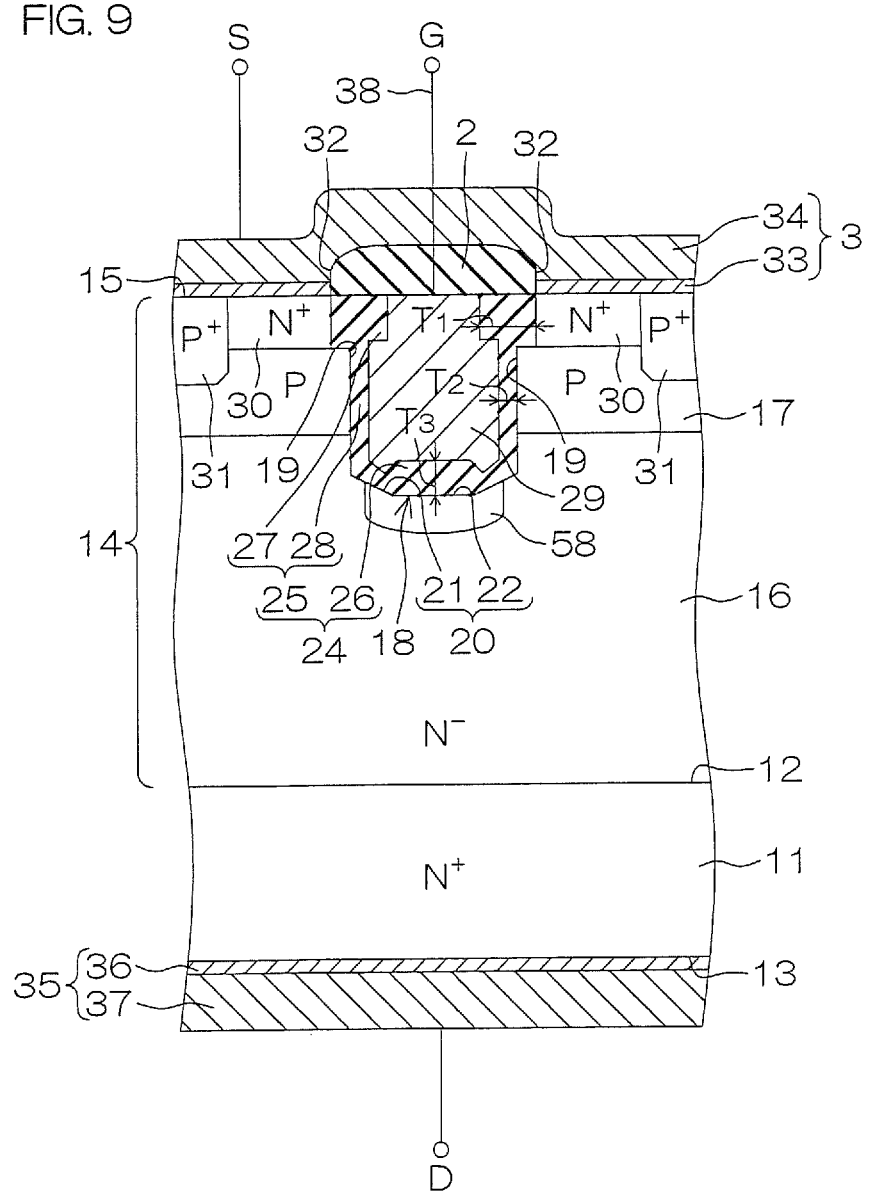

SEMICONDUCTOR DEVICE AND METHOD OF MANUFACTURING SEMICONDUCTOR DEVICE

TECHNICAL FIELD

The present invention relates to a semiconductor device employing SiC and a method of manufacturing the same.

BACKGROUND ART

In recent years, employment of SiC (silicon carbide) has been discussed as the next-generation power device material implementing a high withstand voltage and low on-resistance.

Further, a trench gate structure is known as a structure for refinement of the power device and reduction of the on-resistance. For example, a power MOSFET employing the trench gate structure increasingly forms the mainstream.

FIG. 12 is a schematic sectional view of a conventional SiC semiconductor device having a trench gate VDMOSFET.

A semiconductor device 101 includes an $N^+$-type SiC substrate 102 forming the base of the semiconductor device 101. An $N^-$-type epitaxial layer 103 made of SiC (silicon carbide) doped with an N-type impurity in a lower concentration than the SiC substrate 102 is stacked on an Si plane (a silicon plane) of the SiC substrate 102. A base layer portion of the epitaxial layer 103 forms an $N^-$-type drain region 104 maintaining a state after epitaxy. In the epitaxial layer 103, a P-type body region 105 is formed on the drain region 104 in contact with the drain region 104.

A gate trench 106 is formed in the epitaxial layer 103 to be dug down from a surface 117 (an Si plane) thereof. The gate trench 106 passes through the body region 105 in the thickness direction, and the deepest portion (a bottom surface 116) thereof reaches the drain region 104.

In the gate trench 106, a gate insulating film 107 made of $SiO_2$ is formed on the whole areas of the inner surfaces of the gate trench 106, by thermally oxidizing side surfaces 114 and the bottom surface 116 of the gate trench 106.

A gate electrode 108 is embedded in the gate trench 106 by filling up the inner side of the gate insulating film 107 with polysilicon doped with an N-type impurity in a high concentration.

On a surface layer portion of the epitaxial layer 103, $N^+$-type source regions 109 are formed on both sides of the gate trench 106 in a direction (the right-and-left direction in FIG. 12) orthogonal to the gate width. The source regions 109 extend along the gate trench 106 in a direction along the gate width, and the bottom portions thereof are in contact with the body region 105.

In the epitaxial layer 103, $P^+$-type body contact regions 110 passing through central portions of the source regions 109 in the direction orthogonal to the gate width to be connected to the body region 105 are formed from the surface 117 thereof.

An interlayer dielectric film 111 made of $SiO_2$ is stacked on the epitaxial layer 103. A source wire 112 is formed on the interlayer dielectric film 111. The source wire 112 is grounded. The source wire 112 is electrically connected to the source regions 109 and the body contact regions 110 through contact holes 113 formed in the interlayer dielectric film 111.

A drain wire 115 is formed on the back surface (a carbon plane: C plane) of the SiC substrate 102.

A prescribed voltage (a voltage exceeding a gate threshold voltage) is applied to the gate electrode 108 in a state causing a prescribed potential difference between the source wire 112 and the drain wire 115 (between a source and a drain), whereby a channel is formed in the vicinity of the interface between the body region 105 and the gate insulating film 107 by an electric field from the gate electrode 108. Thus, a current flows between the source wire 112 and the drain wire 115, and the VDMOSFET enters an ON state.

PRIOR ART

Patent Document

Patent Document: Japanese Unexamined Patent Publication No. 2008-294210

SUMMARY OF THE INVENTION

Problems to be Solved by the Invention

The rate of oxidation of each crystal plane of SiC is the smallest on the Si plane. Therefore, oxidation of the inner surface of the gate trench 106 progresses under the condition that the rate of oxidation of the bottom surface 116 (the Si plane) parallel to the surface 117 of the epitaxial layer 103 and the rate of oxidation of the side surfaces 114 satisfy a relational expression: rate of oxidation of bottom surface 116/rate of oxidation of side surfaces 114<1. Consequently, the thickness of a portion on the bottom surface 116 is smaller than the thickness of portions on the side surfaces 114 in the gate insulating film 107.

When the VDMOSFET is turned off in the semiconductor device 101, on the other hand, a high potential difference is caused between the gate electrode 108 and the drain wire 115 (between a gate and the drain), and an electric field concentrates on the bottom surface 116 of the gate trench 106. In the gate insulating film 107 in which the thickness of the portion on the bottom surface 116 is small as described above, dielectric breakdown resulting from the concentration of the electric field easily takes place.

With respect to the inconvenience, a countermeasure of increasing the thickness of the portion on the bottom surface 116 by lengthening an oxidation time in the formation of the gate insulating film 107 is discussed. However, the oxidation of the side surfaces 114 progresses in parallel with the oxidation of the bottom surface 116, and hence the thickness of the portions on the side surfaces 114 extremely increases due to the aforementioned difference between the rates of oxidation.

An object of the present invention is to provide a semiconductor device capable of suppressing dielectric breakdown of a portion on a bottom surface of a gate trench while suppressing increase in the thickness of portions on side surfaces of the gate trench in a gate insulating film and a method of manufacturing the same.

Means for Solving the Problems

A semiconductor device according to the present invention for attaining the object includes a semiconductor layer of a first conductivity type made of SiC, a body region of a second conductivity type formed on a surface layer portion of the semiconductor layer, a gate trench dug down from a surface of the semiconductor layer with a bottom surface formed on a portion of the semiconductor layer under the body region, source regions of the first conductivity type formed on a surface layer portion of the body region adjacently to side surfaces of the gate trench, a gate insulating film formed on the bottom surface and the side surfaces of the gate trench so that the thickness of a portion on the bottom surface is greater than the thickness of portions on the side surfaces, a gate electrode embedded in the gate trench through the gate insulating film, and an implantation layer formed on a portion of the semiconductor layer extending from the bottom surface of the gate trench to an intermediate portion of the semiconductor layer in the thickness direction by implantation of a second conductivity type impurity.

According to this structure, the body region of the second conductivity type is formed on the surface layer portion of the semiconductor layer of the first conductivity type made of SiC. Further, the semiconductor layer is provided with the gate trench dug down from the surface thereof with the bottom surface formed on the portion of the semiconductor layer under the body region. The source regions of the first conductivity type are formed on the surface layer portion of the body region adjacently to the side surfaces of the gate trench. The gate insulating film is formed on the bottom surface and the side surfaces of the gate trench. The gate electrode is embedded in the gate trench through the gate insulating film. The implantation layer is formed on the portion of the semiconductor layer extending from the bottom surface of the gate trench to the intermediate portion in the thickness direction thereof by the implantation of the second conductivity type impurity.

Thus, a trench gate MOSFET having such a MOS (Metal Oxide Semiconductor) structure that the gate electrode (Metal) is opposed to the body region (Semiconductor) through the portions (Oxide) of the gate insulating film on the side surfaces of the gate trench is formed on the semiconductor device. In the MOSFET, a portion of the body region in the vicinity of the interface between the same and the gate insulating film is a channel portion where a channel is formed by an electric field from the gate electrode.

In the semiconductor device, the thickness of the portion of the gate insulating film on the bottom surface is greater than the thickness of the portions on the side surfaces. Therefore, dielectric breakdown of the portion on the bottom surface can be suppressed while suppressing increase in the thickness of the portions on the side surfaces, by properly designing the thickness of the portion of the gate insulating film on the bottom surface.

The semiconductor device can be prepared by a method of manufacturing a semiconductor device according to the present invention, for example. In other words, the semiconductor device can be prepared by a method of manufacturing a semiconductor device including the steps of forming a second conductivity type region on a surface layer portion of a semiconductor layer of a first conductivity type made of SiC by implanting a second conductivity type impurity from a surface of the semiconductor layer, forming a first conductivity type region on a surface layer portion of the second conductivity type region by implanting a first conductivity type impurity from a surface of the second conductivity type region, forming a body region and a source region by activating the second conductivity type region and the first conductivity type region by a heat treatment, forming a gate trench dug down from the surface in the semiconductor layer, covering side surfaces of the gate trench with a mask, forming an implantation layer on a portion extending from a bottom surface of the gate trench to an intermediate portion of the semiconductor layer in the thickness direction by implanting a second conductivity type impurity from the bottom surface of the gate trench into the semiconductor layer after the formation of the mask, forming a gate insulating film on the bottom surface and the side surfaces by removing the mask and oxidizing the bottom surface and the side surfaces of the gate trench after the formation of the implantation layer, and forming a gate electrode on the gate insulating film to fill up the gate trench.

According to the method, the second conductivity type region is formed by implanting the second conductivity type impurity into the semiconductor layer. Further, the first conductivity type region is formed by implanting the first conductivity type impurity into the semiconductor layer. The second conductivity type impurity region and the first conductivity type impurity region are activated by the heat treatment, so that the second conductivity type impurity region forms the body region and the first conductivity type impurity region forms the source region.

On the other hand, the gate trench is formed in the semiconductor layer, to be dug down from the surface thereof. The side surfaces of the gate trench are covered with the mask, and the second conductivity type impurity is implanted from the bottom surface of the gate trench into the semiconductor layer in the state where the side surfaces are covered. Thus, the implantation layer is formed on the semiconductor layer. After the formation of the implantation layer, the mask is removed, and the gate insulating film is formed by oxidizing the bottom surface and the side surfaces of the gate trench. The gate electrode is formed on the gate insulating film, to fill up the gate trench.

The implantation layer is formed in advance of the oxidation of the bottom surface and the side surfaces of the gate trench, whereby the oxidation of the bottom surface and the side surfaces of the gate trench after the formation of the implantation layer progresses under the condition that the rate of oxidation of the bottom surface of the gate trench and the rate of oxidation of the side surfaces satisfy a relational expression: rate of oxidation of bottom surface/rate of oxidation of side surfaces >1. Consequently, such a gate insulating film that the thickness of a portion on the bottom surface is greater than the thickness of portions on the side surfaces can be formed.

The side surfaces of the gate trench are covered with the mask in the formation of the implantation layer, whereby implantation of the second conductivity type impurity from the side surfaces of the gate trench into the semiconductor layer can be suppressed.

The implantation layer is preferably an active layer provided with conductivity by activation of the second conductivity type impurity. Thus, an energy barrier formed between the implantation layer and the semiconductor layer can be increased, whereby a current can be rendered hardly flowable to the implantation layer.

The implantation layer may be an insulating layer maintaining an inactive state of the second conductivity type impurity after the implantation.

In the gate insulating film on the side surfaces of the gate trench, the thickness $T_1$ of portions adjacent to the source regions is preferably not less than the thickness $T_2$ of remaining portions.

As an index expressing the switching performance of a trench gate MOSFET, the product $R_{on} \cdot Q$ of on-resistance $R_{on}$ of the MOSFET and a gate charge quantity Q is employed, for example. The switching performance is improved as $R_{on} \cdot Q$ is reduced, and hence the gate charge quantity is preferably as small as possible. The gate charge quantity denotes the quantity of charges stored in a capacitance (a capacitance of a portion (a portion between a gate electrode and a source region) of a gate insulating film held between the gate electrode and the source region, for example) parasitically formed on a gate.

If $T_1$ is not less than $T_2$, the distances between the gate electrode and the source regions can be increased, whereby the capacitances of portions of the gate insulating film between the gate electrode and the source regions can be reduced. Consequently, the quantity of gate charges stored in the parasitic capacitance of the gate can be reduced, whereby the switching performance of the MOSFET can be improved.

The ratio ($T_1/T_2$) of the thickness $T_1$ of the portions adjacent to the source regions to the thickness $T_2$ of the remaining portions of the gate insulating film may be 1 to 3, for example. The portions of the gate insulating film adjacent to the source regions may protrude on both of the inner side and the outer side of the gate trench with respect to the side surfaces of the gate trench.

The ratio ($T_3/T_2$) of the thickness $T_3$ of the portion of the gate insulating film on the bottom surface of the gate trench to the thickness $T_2$ of the remaining portions of the gate insulating film may be 1 to 2, for example.

The surface of the semiconductor layer is preferably an Si plane. In this case, the bottom surface of the gate trench can be formed by an Si plane. In an SiC semiconductor crystal, the rate of oxidation of an Si plane is faster than the rate of oxidation of a C plane, and hence the rate of oxidation of the bottom surface of the gate trench can be more increased if the bottom surface of the gate trench is an Si plane. Therefore, the thickness of the gate insulating film on the side surfaces of the gate trench can be prevented from exceeding a necessary level at the time of forming the gate insulating film of a desired thickness on the bottom surface of the gate trench. If the bottom surface of the gate trench is a C plane, on the other hand, the thickness of the gate insulating film on the side surfaces of the gate trench may exceed the necessary level at the time of forming the gate insulating film of the desired thickness on the bottom surface of the gate trench. Consequently, there is an apprehension that the gate insulating film is too thick to form a channel even if a gate threshold voltage is applied to the gate electrode.

The bottom surface of the gate trench may include inclined portions formed on both end portions of the side surfaces of the gate trench opposed to each other in the opposed direction and inclined from the respective lower ends of the side surfaces toward the surface of the semiconductor layer, and a parallel portion connecting lower ends of the inclined portions with each other and parallel to the surface of the semiconductor layer. Thus, electric field concentration on both end portions of the bottom surface of the gate trench can be suppressed when the semiconductor device is turned off. When the bottom surface of the gate trench has the parallel portion, the implantation layer is preferably formed in contact with the whole area of the parallel portion. Thus, a portion of the gate insulating film on the parallel portion can be thickened as a whole.

The bottom surface of the gate trench may be provided in the form of an arc in sectional view having bent surfaces bent toward the semiconductor layer on both end portions of the side surfaces of the gate trench opposed to each other in the opposed direction. Also in this case, electric field concentration on both end portions of the bottom surface of the gate trench can be suppressed when the semiconductor device is turned off, similarly to the case where the bottom surface of the gate trench has the inclined portions on both end portions.

The depth of the implantation layer may be 0.1 μm to 0.5 μm, and the second conductivity type impurity concentration in the implantation layer may be $1 \times 10^{16}$ cm$^{-3}$ to $1 \times 10^{21}$ cm$^{-3}$.

In the method of manufacturing a semiconductor device, the step of forming the gate trench may include the steps of forming a first mask on the surface of the semiconductor layer and etching the semiconductor layer through the first mask, and the step of covering the side surfaces with the mask may include the steps of forming a second mask made of a different material from the first mask on the bottom surface and the side surfaces as well as on the first mask and removing a portion of the second mask on the bottom surface by etching.

In this method, the first mask and the second mask are made of materials different from each other, whereby etching rates of the first mask and the second mask with respect to an etchant or etching gas are different from each other.

Therefore, the first mask can be utilized as an etching stopper when etching the second mask by properly selecting the materials for the first mask and the second mask so that the selection ratio of the first mask and the second mask reaches a proper value.

In the step of removing the portion of the second mask on the bottom surface by etching, therefore, progress of the etching on the first mask can be stopped on the first mask at the time when the second mask on the surface of the semiconductor layer is removed along with the portion on the bottom surface. Consequently, the surface of the semiconductor layer can be prevented from being corroded.

In the method of manufacturing a semiconductor device, the surface of the semiconductor layer may be an Si plane, and the step of covering the side surfaces with the mask may be a step of forming a silicon oxide film on the bottom surface and the side surfaces by oxidizing the bottom surface and the side surfaces.

In this method, the surface of the semiconductor layer is an Si plane, and hence the bottom surface of the gate trench dug down from the Si plane is an Si plane.

Therefore, the oxidation of the bottom surface and the side surfaces of the gate trench before the formation of the implantation layer progresses under the condition that the rate of oxidation of the bottom surface of the gate trench and the rate of oxidation of the side surfaces satisfy a relational expression: rate of oxidation of bottom surface/rate of oxidation of side surfaces <1. Consequently, such a silicon oxide film that the thickness of a portion on the bottom surface is smaller than the thickness of portions on the side surfaces can be formed. Therefore, implantation of the second conductivity type impurity from the side surfaces of the gate trench can be efficiently suppressed while enabling implantation of the second conductivity type impurity from the bottom surface of the gate trench in the formation of the implantation layer, by forming the silicon oxide film under a proper oxidation condition.

In the method of manufacturing a semiconductor device, the step of forming the implantation layer may be carried out before the step of forming the body region and the source region.

In this method, the implantation layer is formed before the step of forming the body region and the source region, whereby the second conductivity type impurity in the implantation layer can be activated in the heat treatment in the step of forming the body region and the source region. Thus, the implantation layer can be formed as an active layer provided with conductivity.

In the method of manufacturing a semiconductor device, the step of forming the implantation layer may be carried out after the step of forming the body region and the source region.

In this method, the implantation layer is formed after the step of forming the body region and the source region, whereby the implantation layer is not exposed to the heat treatment in the step of forming the body region and the source region. Therefore, the state of the implantation layer can be maintained in the inactive state of the second conductivity type impurity after the implantation. Thus, the implantation layer can be formed as an insulating layer. Further, when the step of forming the gate trench is carried out after the step of forming the body region and the source region, for example, the gate trench is not exposed to the heat treatment in the step of forming the body region and the source region. Therefore, deformation or the like of the gate trench by the heat treatment can also be prevented.

BRIEF DESCRIPTION OF DRAWINGS

FIG. 4A is a schematic sectional view for illustrating a method of manufacturing the semiconductor device shown in FIG. 3.

FIG. 4B is a diagram showing a step subsequent to FIG. 4A.

FIG. 4E is a diagram showing a step subsequent to FIG. 4D.

FIG. 4F is a diagram showing a step subsequent to FIG. 4E.

FIG. 4Q is a diagram showing a step subsequent to FIG. 4P.

FIG. 5 is a schematic sectional view of a semiconductor device according to a second embodiment of the present invention.

FIG. 6C is a diagram showing a step subsequent to FIG. 6B.

FIG. 6D is a diagram showing a step subsequent to FIG. 6C.

FIG. 6O is a diagram showing a step subsequent to FIG. 6N.

FIG. 7 is a schematic sectional view of a semiconductor device according to a third embodiment of the present invention.

FIG. 8K is a diagram showing a step subsequent to FIG. 8J.

FIG. 8L is a diagram showing a step subsequent to FIG. 8K.

FIG. 8Q is a diagram showing a step subsequent to FIG. 8P.

FIG. 9 is a schematic sectional view of a semiconductor device according to a fourth embodiment of the present invention.

DESCRIPTION OF EMBODIMENTS

Embodiments of the present invention are now described in detail with reference to the accompanying drawings.

Figure 1:
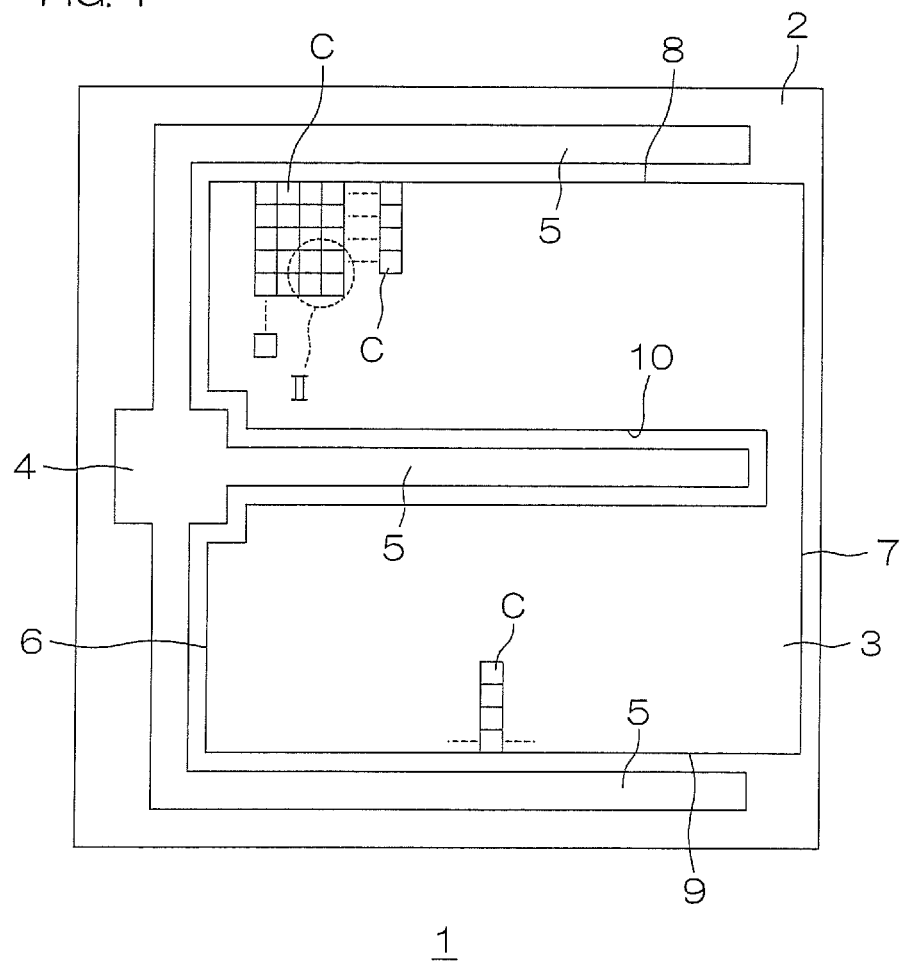
FIG. 1 is a schematic plan view of a semiconductor device according to a first embodiment of the present invention.

FIG. 1 is a schematic plan view of a semiconductor device according to a first embodiment of the present invention.

A semiconductor device 1 is formed in a square shape in plan view, and an interlayer dielectric film 2 is formed on a surface side thereof.

A source electrode 3, a gate pad 4 and gate fingers 5 are formed on the interlayer dielectric film 2.

The source electrode 3 is formed in a square shape in plan view having a region (a removed region 10) concavely removed in plan view from a first side edge 6 to the side of a second side edge 7 opposed to the first side edge 6 in a central portion thereof, and so arranged that the side edges are parallel to side edges of the semiconductor device 1 respectively.

The gate pad 4 is formed in a square shape in plan view, and provided around an open portion of the concave removed region 10 of the source electrode 3 in a noncontact manner at an interval with respect to the source electrode 3.

Three gate fingers 5 are formed integrally with the gate pad 4 in this embodiment. The three gate fingers 5 extend from the open side of the removed region 10 of the source electrode 3 toward the side opposite thereto one by one in the removed region 10 and outside a third side edge 8 and a fourth side edge 9 of the source electrode 3 orthogonal to the first side edge 6 parallelly to one another, and are provided in a noncontact manner at intervals with respect to the source electrode 3.

The gate pad 4 and the gate fingers 5 are made of the same metallic material. Preferably, the gate pad 4 and the gate fingers 5 are made of the same metallic material as the source electrode 3. When the source electrode 3, the gate pad 4 and the gate fingers 5 are made of the same metallic material, the source electrode 3, the gate pad 4 and the gate fingers 5 can be formed by forming a film made of the metallic material on the whole area of the surface of the interlayer dielectric film 2 and patterning the film.

Under the source electrode 3, a large number of unit cells C of a trench gate VDMOSFET (Vertical Double diffused Metal Oxide Semiconductor Field Effect Transistor) consisting of respective portions described below are arranged and provided in the form of a matrix (in rows and columns) in plan view.

Figure 2:
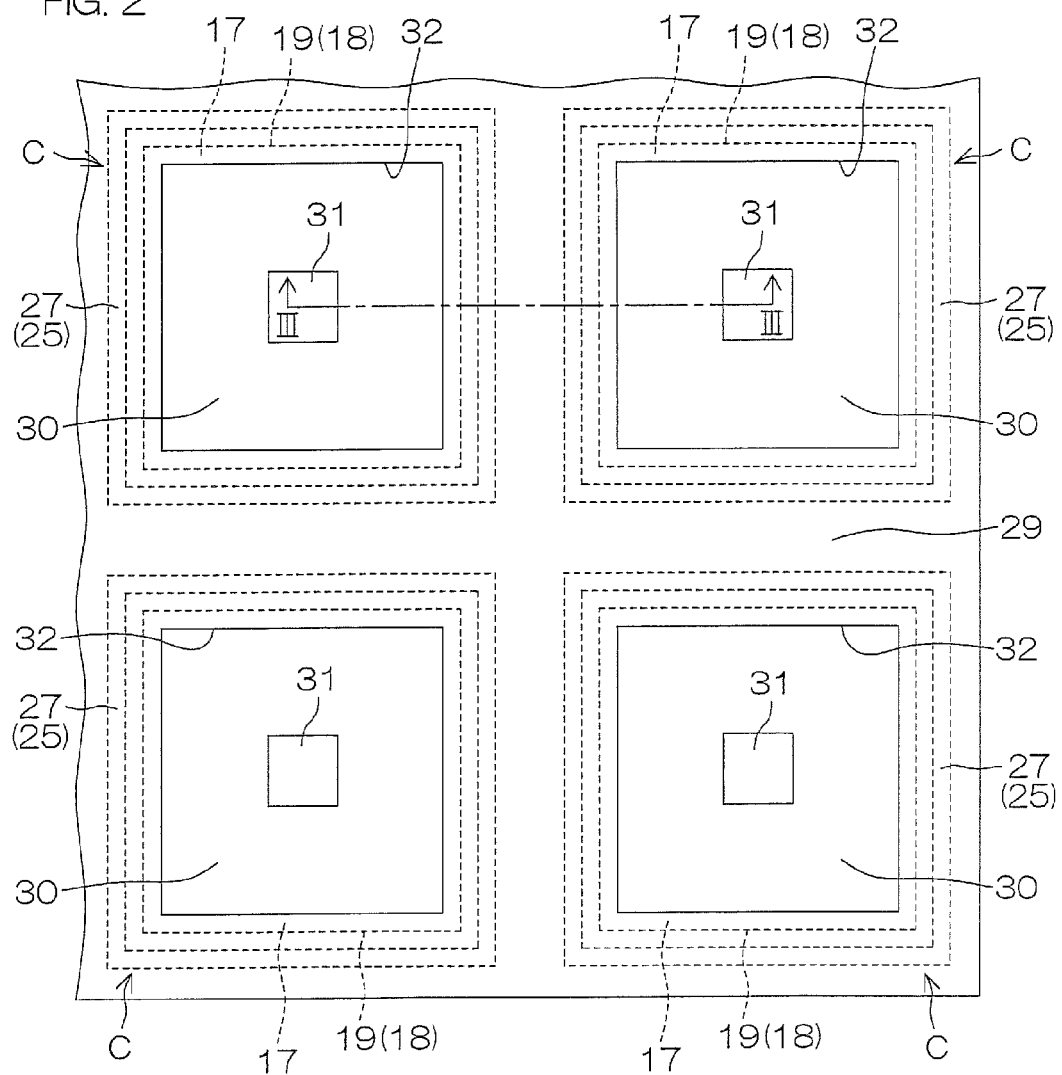
FIG. 2 is an enlarged view of a principal portion surrounded by a broken-line circle II in FIG. 1.
Figure 3:
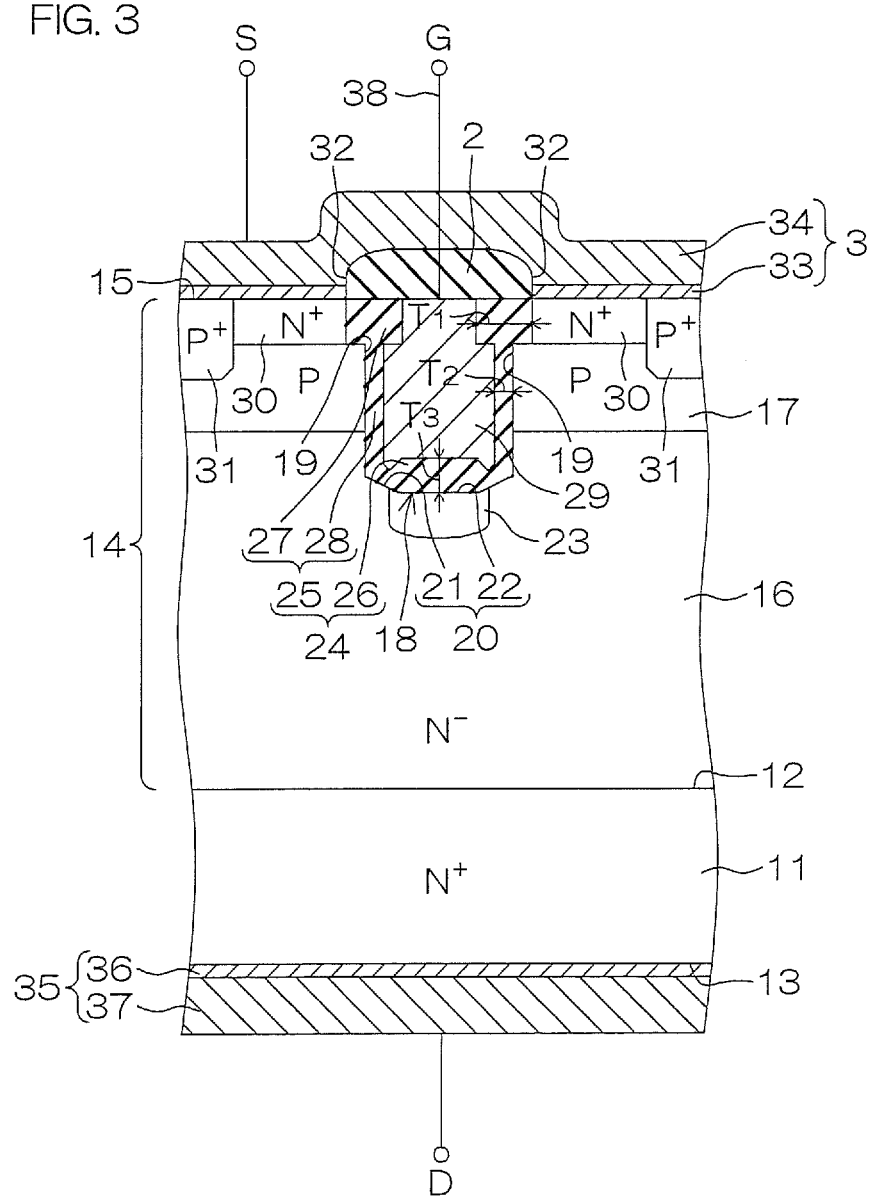
FIG. 3 is a schematic sectional view of the semiconductor device according to the first embodiment of the present invention, showing a cutting plane along a cutting plane line III-III in FIG. 2.

FIG. 2 is an enlarged view of a principal portion surrounded by a broken-line circle II in FIG. 1. FIG. 3 is a schematic sectional view of the semiconductor device according to the first embodiment of the present invention, showing a cutting plane along a cutting plane line III-III in FIG. 2.

The semiconductor device 1 includes an SiC substrate 11 forming the base of the semiconductor device 1. The SiC substrate 11 is doped with an N-type impurity in a high concentration ($1 \times 10^{18}$ cm$^{-3}$ to $1 \times 10^{21}$ cm$^{-3}$, for example). In the SiC substrate 11, a surface 12 (an upper surface) thereof is an Si plane, and a back surface 13 (a lower surface) thereof is a C plane.

An N$^-$-type epitaxial layer 14 made of SiC (silicon carbide) doped with an N-type impurity in a lower concentration than the SiC substrate 11 is stacked on the surface 12 of the SiC substrate 11. The epitaxial layer 14 as a semiconductor layer formed on the surface 12 which is an Si plane grows with an Si plane as a major growth surface. Therefore, a surface 15 of the epitaxial layer 14 is an Si plane.

A portion (a base layer portion) of the epitaxial layer 14 closer to a C plane side opposite to a portion (a surface layer portion) closer to the Si plane forms an N$^-$-type drain region 16 maintaining a state after epitaxy on the whole area thereof. The N-type impurity concentration in the drain region 16 is $1 \times 10^{15}$ cm$^{-3}$ to $1 \times 10^{17}$ cm$^{-3}$, for example.

On a surface layer portion of the epitaxial layer 14, on the other hand, a plurality of body regions 17 are arrayed in the form of a matrix (in rows and columns) in plan view, by one for each unit cell C. Each body region 17 is square-shaped in plan view. Further, each body region 17 exhibits a P conductivity type, and is formed on a region extending from the surface 15 of the epitaxial layer 14 to an intermediate portion in the depth direction at an interval from another body region 17 in a direction orthogonal to the thickness direction of the epitaxial layer 14, and the deepest portion thereof reaches the drain region 16. The P-type impurity concentration in the body region 17 is $1 \times 10^{15}$ cm$^{-3}$ to $1 \times 10^{19}$ cm$^{-3}$, for example.

Gate trenches 18 are formed in the epitaxial layer 14 to be dug down from the surface 15. The gate trenches 18 are in the form of a lattice having a constant width partitioning the unit cells C (the body regions 17) arrayed in the form of a matrix at a constant pitch. In each unit cell C, the depth direction of the body region 17 is a gate length direction, and the circumferential direction of the body region 17 orthogonal to the gate length direction is a gate width direction.

Each gate trench 18 has side surfaces 19 opposed to each other at an interval and a bottom surface 20 connecting lower ends of the side surfaces 19 with each other.

Each side surface 19 is a plane generally orthogonal to the surface 15 of the epitaxial layer 14.

The bottom surface 20 is formed in the drain region 16. In other words, the gate trench 18 passes through the body region 17 in the layer thickness direction, and the deepest portion (the bottom surface 20) thereof reaches the drain region 16. The bottom surface 20 has inclined portions 21 inclined from the lower ends of the respective side surfaces 19 with respect to the surface 15 in the depth direction of the gate trench 18 and a parallel portion 22 connecting lower ends of the inclined portions 21 with each other and parallel to the surface 15.

The distance (the distance between the pair of side surfaces 19) of the gate trench 18 in a direction orthogonal to the gate width is 0.5 μm to 1.0 μm, for example.

In the drain region 16, an implantation active layer 23 formed by implantation of a P-type impurity is formed on a portion extending from the bottom surface 20 of the gate trench 18 to an intermediate portion in the thickness direction thereof. The implantation active layer 23 is provided to be in contact with generally the whole area of the parallel portion 22 of the bottom surface 20, and the depth thereof is 0.1 μm to 0.5 μm, for example, and preferably 0.2 μm to 0.3 μm. In this embodiment, the depth of the implantation active layer 23 is 0.3 μm.

The implantation active layer 23 is a layer (an active layer) activated by activation of the P-type impurity, and a high-resistance layer having a higher resistance value than the peripheral region (the drain region 16, for example) in the epitaxial layer 14. The resistance value of the implantation active layer 23 is several 10 kΩ/□ to several 100 kΩ/□, for example. The P-type impurity concentration in the implantation active layer 23 is $1 \times 10^{16}$ cm$^{-3}$ to $1 \times 10^{21}$ cm$^{-3}$, for example, and preferably $1 \times 10^{18}$ cm$^{-3}$ to $1 \times 10^{19}$ cm$^{-3}$. According to this embodiment, the P-type impurity contained in the implantation active layer 23 is B (boron), and the concentration thereof is $1 \times 10^{19}$ cm$^{-3}$.

A gate insulating film 24 made of SiO$_2$ is formed in the gate trench 18, to cover the whole areas of the inner surfaces (the side surfaces 19 and the bottom surface 20) of the gate trench 18.

In portions (insulating film side portions 25) of the gate insulating film 24 on the side surfaces 19, portions (source adjacent portions 27) adjacent to source regions 30 protrude on both of the inner side and the outer side of the gate trench 18 with respect to the side surfaces 19, whereby the thickness $T_1$ of the source adjacent regions 27 is greater than the thickness $T_2$ of portions (body adjacent portions 28) adjacent to the remaining portions (the body region 17 and the drain region 16) thereof. The ratio (thickness $T_1$ of source adjacent portions 27/thickness $T_2$ of body adjacent portions 28) of the thickness $T_1$ of the source adjacent portions 27 to the thickness $T_2$ of the body adjacent portions 28 is 1 to 3, for example, and preferably 2 to 3. As to the specific sizes of the thicknesses, the thickness $T_1$ of the source adjacent portions 27 is 1000 Å to 2000 Å, and the thickness $T_2$ of the body adjacent portions 28 is 400 Å to 500 Å, for example.

On the other hand, a portion (an insulating film bottom portion 26) of the gate insulating film 24 on the bottom surface 20 has a portion having a greater thickness than the thickness $T_2$ of the body adjacent portions 28 in a portion on the parallel portion 22 of the bottom surface 20. The ratio (thickness $T_3$ of insulating film bottom portion 26/thickness $T_2$ of body adjacent portions 28) of the thickness $T_3$ (this thickness may hereinafter be referred to as the thickness $T_3$ of the insulating film bottom portion 26) of the portion of the insulating film bottom portion 26 having the large thickness to the thickness $T_2$ of the body adjacent portions 28 is 1 to 2, for example, and preferably 2. The specific thickness of the insulating film bottom portion 26 is 1000 Å to 2000 Å, for example.

The inner side of the gate insulating film 24 is filled up with a polysilicon material doped with an N-type impurity in a high concentration, whereby a gate electrode 29 is embedded in the gate trench 18.

The source region 30 of an N$^+$-type is formed on a surface layer portion of each body region 17. The source region 30 is a region doped with an N-type impurity in a high concentration, to be higher than the N-type impurity concentration in the drain region 16. The N-type impurity concentration in the source region 30 is $1 \times 10^{18}$ cm$^{-3}$ to $1 \times 10^{21}$ cm$^{-3}$, for example. The source region 30 extends in a direction along the gate width on a position adjacent to the gate trench 18, and the bottom portion thereof is in contact with the body region 17 from the side of the surface 15 of the epitaxial layer 14.

A P$^+$-type body contact region 31 is formed on the inner side of each source region 30 to pass through a central portion of the source region 30 in the depth direction. The body contact region 31 is a region doped with a P-type impurity in a high concentration, to be higher than the P-type impurity concentration in the body region 17. The P-type impurity concentration in the body contact region 31 is $1 \times 10^{18}$ cm$^{-3}$ to $1 \times 10^{21}$ cm$^{-2}$, for example.

The interlayer dielectric film 2 made of SiO$_2$ is stacked on the surface 15 of the epitaxial layer 14. In the interlayer dielectric film 2, a contact hole 32 is formed on a position opposed to each body contact region 31. Each contact hole 32 passes through the interlayer dielectric film 2, and the whole area of the body contact region 31 and a portion of the source region 30 around the body contact region 31 face the inner portion of each contact hole 32.

The source electrode 3 is formed on the interlayer dielectric film 2. The source electrode 3 is brought into contact with (electrically connected to) the source region 30 and the body contact region 31 through the contact hole 32. The source electrode 3 has a nickel silicide layer 33 on a portion in contact with the source region 30 and the body contact region 31, and has a metal layer 34 on the nickel silicide layer 33.

The metal layer 34 is made of aluminum (Al), gold (Au), silver (Ag), copper (Cu), an alloy thereof or a metallic material containing the same, for example. The metal layer 34 forms the outermost layer of the source electrode 3, and a metal wire or the like is connected (bonded) thereto, for example. The thickness of the metal layer 34 is 1 μm to 5 μm, for example.

A drain electrode 35 is formed on the back surface 13 of the SiC substrate 11. The drain electrode 35 is brought into contact with (electrically connected to) the SiC substrate 11. The drain electrode 35 has a nickel silicide layer 36 on a portion in contact with the SiC substrate 11, and has a metal layer 37 on the nickel silicide layer 36.

The metal layer 37 can be made of a substance similar to the aforementioned material constituting the metal layer 34. The metal layer 37 forms the outermost layer of the drain electrode 35, and bonded to a die pad when the SiC substrate 11 is bonded to the die pad of a lead frame, for example. The thickness of the metal layer 37 is 1 μm to 5 μm, for example.

A gate wire 38 is brought into contact with (electrically connected to) a gate electrode 29 through a contact hole (not shown) formed in the interlayer dielectric film 2. The gate wire 38 is electrically connected to the gate pad 4.

A prescribed voltage (a voltage of not less than a gate threshold voltage) is applied to the gate pad 4 in a state causing a prescribed potential difference between the source electrode 3 and the drain electrode 35 (between a source and a drain), whereby a channel is formed in the vicinity of the interface between the body region 17 and the gate insulating film 24 due to an electric field from the gate electrode 29. Thus, a current flows between the source electrode 3 and the drain electrode 35, and the VDMOSFET enters an ON-state.

FIGS. 4A to 4Q are schematic sectional views for illustrating a method of manufacturing the semiconductor device shown in FIG. 3.

First, an SiC crystal is grown on the surface 12 (the Si plane) of the SiC substrate 1 by epitaxy such as CVD (Metal Organic Chemical Vapor Deposition), LPE (Liquid Phase Epitaxy) or MBE (Molecular Beam Epitaxy) while doping the same with an impurity, as shown in FIG. 4A. Thus, the N$^-$-type epitaxial layer 14 is formed on the SiC substrate 11. Then, a P-type impurity is implanted from the surface 15 of the epitaxial layer 14 into the inner portion of the epitaxial layer 14. While the implantation conditions at this time vary with the type of the P-type impurity, acceleration energy is 300 keV to 400 keV, for example.

Thus, a P-type implantation region 39 as a second conductivity type region into which the P-type impurity is implanted is formed on the surface layer portion of the epitaxial layer 14, as shown in FIG. 4B. Due to the formation of the P-type implantation region 39, the drain region 16 separated from the P-type implantation region 39 and maintaining the state after the epitaxy is formed on the base layer portion of the epitaxial layer 14.

Figure 4C:
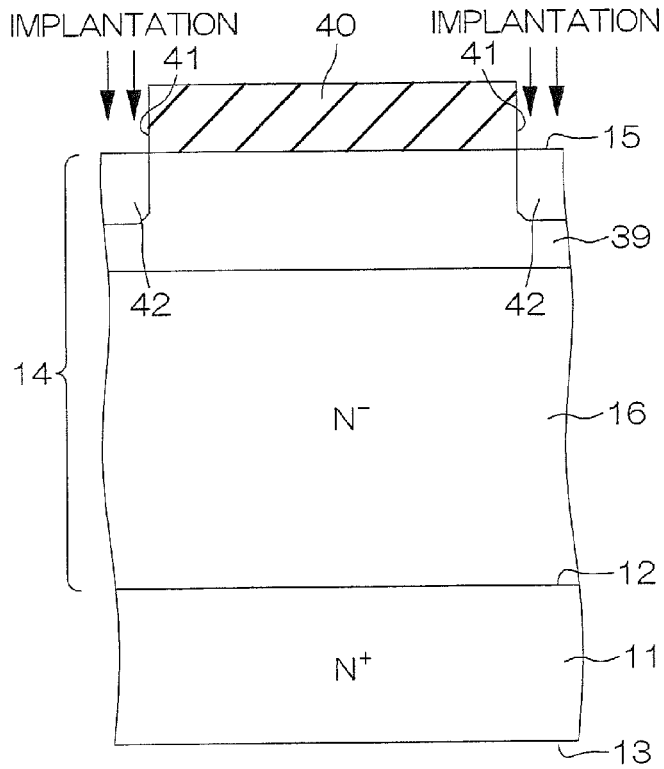
FIG. 4C is a diagram showing a step subsequent to FIG. 4B.

Then, a mask 40 made of SiO$_2$ is formed on the epitaxial layer 14 by CVD, as shown in FIG. 4C. Then, the mark 40 is etched through a photoresist (not shown), to be patterned into a pattern having openings 41 in regions for forming the body contact regions 31. After the formation of the openings 41, a P-type impurity is implanted from the surface 15 of the epitaxial layer 14 into the inner portion of the epitaxial layer 14.

Thus, P+-type implantation regions 42 into which the P-type impurity is implanted are formed on a surface layer portion of the P-type implantation region 39. While the implantation conditions at this time vary with the type of the P-type impurity, acceleration energy is 30 kEV to 180 kEV, for example. After the formation of the P+-type implantation regions 42, the mask 40 is removed.

Figure 4D:
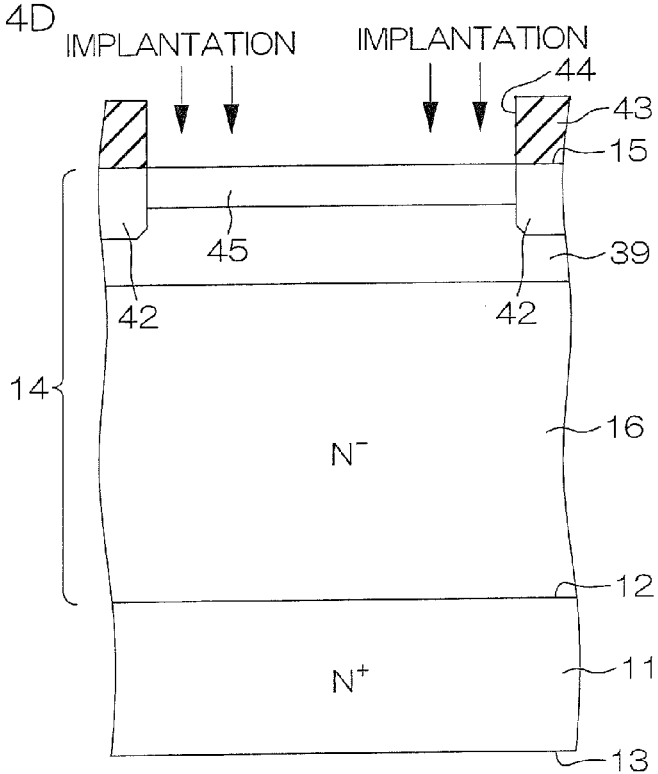
FIG. 4D is a diagram showing a step subsequent to FIG. 4C.

Then, a mask 43 made of $SiO_2$ is formed on the epitaxial layer 14 by CVD, as shown in FIG. 4D. Then, the mask 43 is etched through a photoresist (not shown), to be patterned into a pattern having an opening 44 in regions for forming the source regions 30. After the formation of the opening 44, an N-type impurity is implanted from the surface 15 of the epitaxial layer 15 into the inner portion of the epitaxial layer 14. Thus, an N+-type implantation region 45 as a first conductivity type into which the N-type impurity is implanted is formed on a surface layer portion of the P-type implantation region 39. While the implantation conditions at this time vary with the type of the N-type impurity, acceleration energy is 30 kEV to 180 kEV, for example. After the implantation of the N-type impurity, the mask 43 is removed.

Then, a trench forming mask 46 as a first mask made of $SiO_2$ is formed on the whole area of the surface 15 of the epitaxial layer 14 by CVD, thermal oxidation or the like, as shown in FIG. 4E. The trench forming mask 46 can also be made of SiN or the like, by utilizing CVD.

Then, the trench forming mask 46 is etched through a photoresist (not shown), to be patterned into a pattern having an opening 47 in a region for forming the gate trench 18, as shown in FIG. 4F.

Figure 4G:
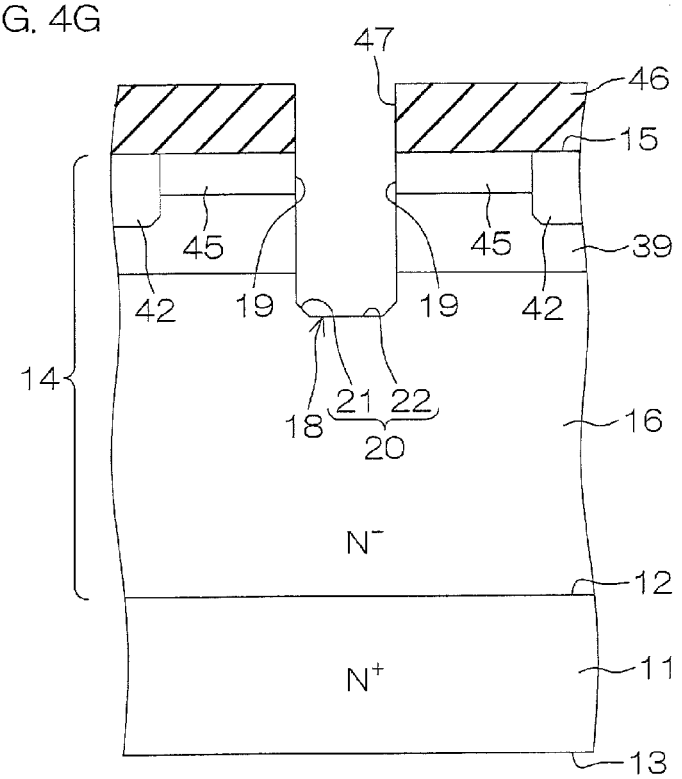
FIG. 4G is a diagram showing a step subsequent to FIG. 4F.

Then, mixed gas ($SF_6/O_2$/HBr gas) containing $SF_6$ (sulfur hexafluoride), $O_2$ (oxygen) and HBr (hydrogen bromide) is introduced into the surface 15 of the epitaxial layer 14 through the opening 47, as shown in FIG. 4G. Thus, the epitaxial layer 14 is dry-etched from the surface 15 (the Si plane), and the gate trench 18 is formed.

Figure 4H:
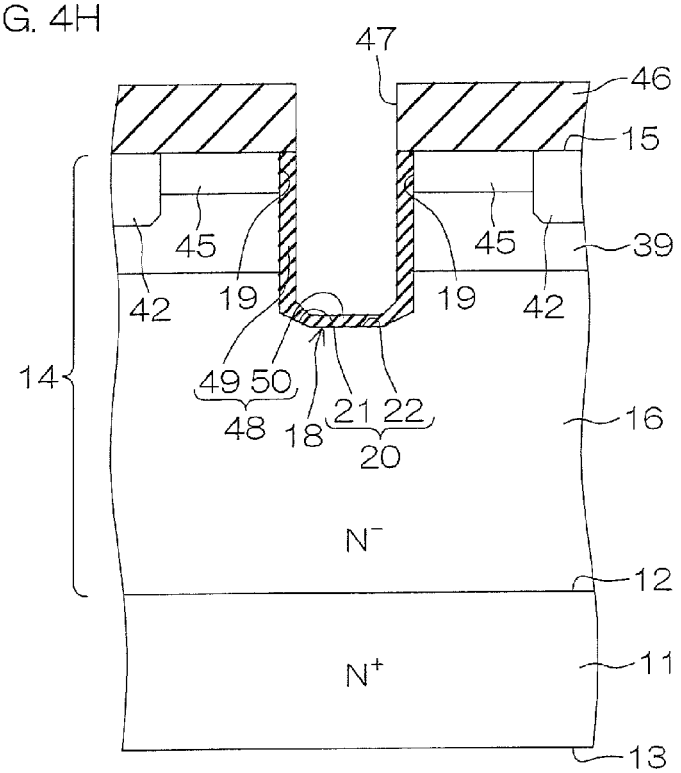
FIG. 4H is a diagram showing a step subsequent to FIG. 4G.

Then, the inner surfaces (the side surfaces 19 and the bottom surface 20) of the gate trench 18 are oxidized by thermal oxidation (Dry oxidation) employing $O_2$ gas, as shown in FIG. 4H. The $O_2$ gas is supplied at 1200° C. for 0.5 hours to 1.0 hour, for example. The gate trench 18 is formed in the epitaxial layer 14 made of SiC, whereby the oxidation of the inner surfaces of the gate trench 18 progresses under the condition that the rate of oxidation of the parallel portion 22 which is the Si plane and the rate of oxidation of the side surfaces 19 which are planes orthogonal to the Si plane satisfy a relational expression: rate of oxidation of parallel portion 22/rate of oxidation of side surfaces 19=0.1 to 0.2<1, for example. Thus, such a stopper film 48 is formed that the thickness of a portion (a stopper film bottom portion 50) on the bottom surface 20 (the parallel portion 22) is smaller than the thickness of portions (stopper film side portions 49) on the side surfaces 19.

Figure 4I:
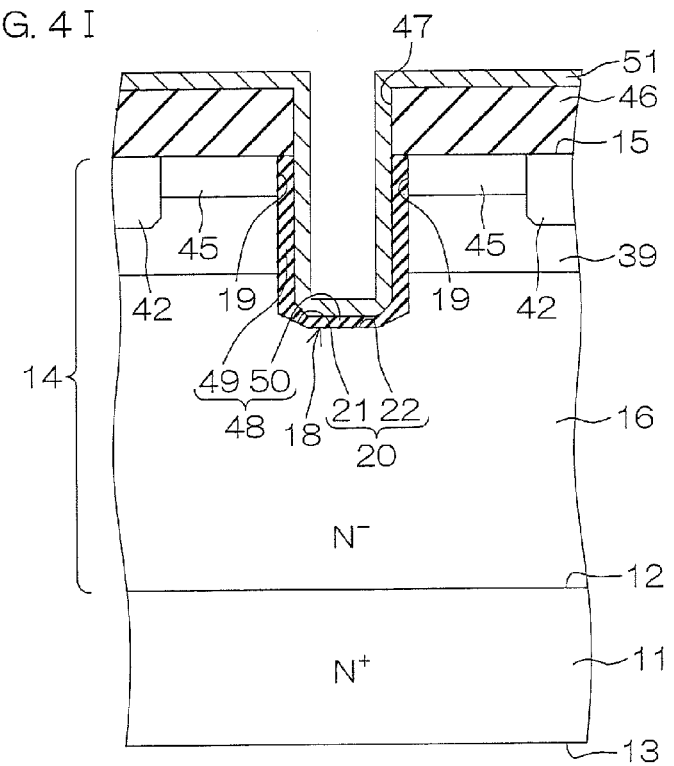
FIG. 4I is a diagram showing a step subsequent to FIG. 4H.

Then, a polysilicon material which is a material different from the material ($SiO_2$) for the trench forming mask 46 is deposited on the epitaxial layer 14 by CVD until the whole area of the surface of the stopper film 48 and the whole area of the surface of the trench forming mask 46 are entirely covered, as shown in FIG. 4I. Thus, a trench protective mask 51 as a second mask is formed on the stopper film 48 and the trench forming mask 46. The thickness of the trench protective mask 51 is controlled to be 0.1 µm to 0.5 µm, for example.

Figure 4J:
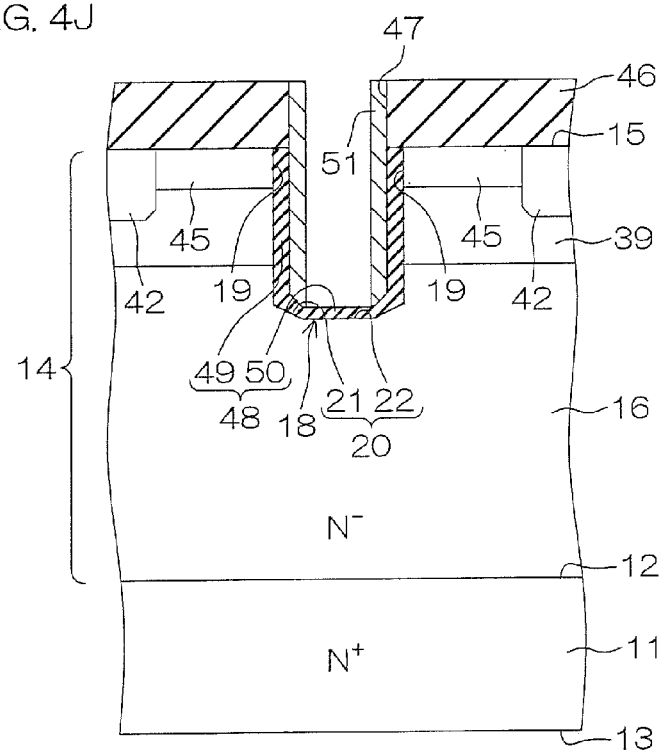
FIG. 4J is a diagram showing a step subsequent to FIG. 4I.

Then, the trench protective mask 51 is etched back from above the epitaxial layer 14, as shown in FIG. 4J. The etch-back is continued until the etching stops due to the stopper film bottom portion 50 of the stopper film 48. Thus, portions of the trench protective mask 51 on the stopper film bottom portion 50 and the trench forming mask 46 are removed by the etching, and portions of the trench protective mask 51 on the stopper film side portions 49 remain.

Figure 4K:
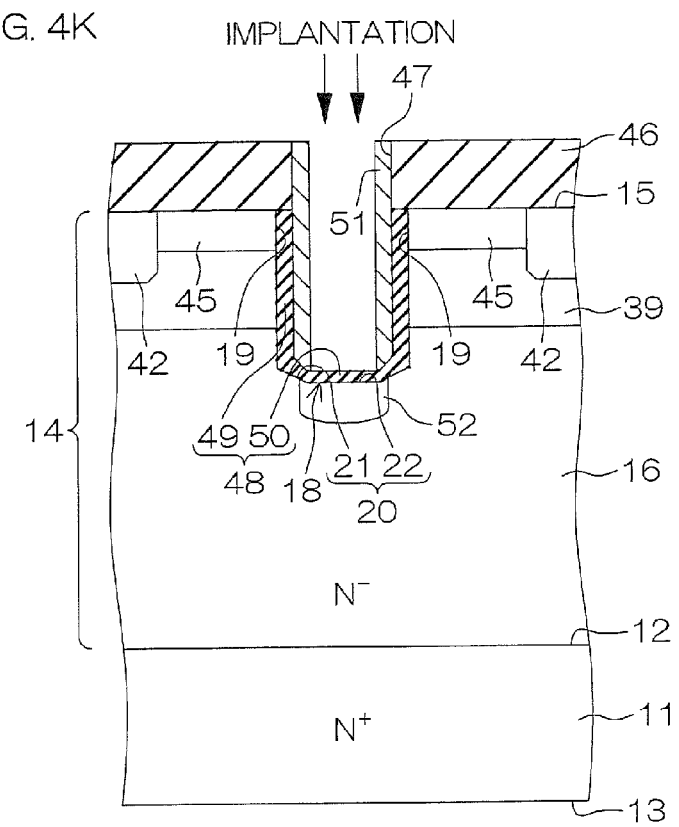
FIG. 4K is a diagram showing a step subsequent to FIG. 4J.

Then, a P-type impurity is implanted from the bottom surface 20 of the gate trench 18 into the inner portion of the epitaxial layer 14 through the stopper film bottom portion 50, as shown in FIG. 4K. While the implantation conditions at this time vary with the type of the P-type impurity, acceleration energy is 30 kEV to 180 kEV, for example. Thus, an implantation layer 52 is formed on a portion of the epitaxial layer 14 extending from the bottom surface 20 of the gate trench 18 to an intermediate portion in the thickness direction thereof.

Figure 4L:
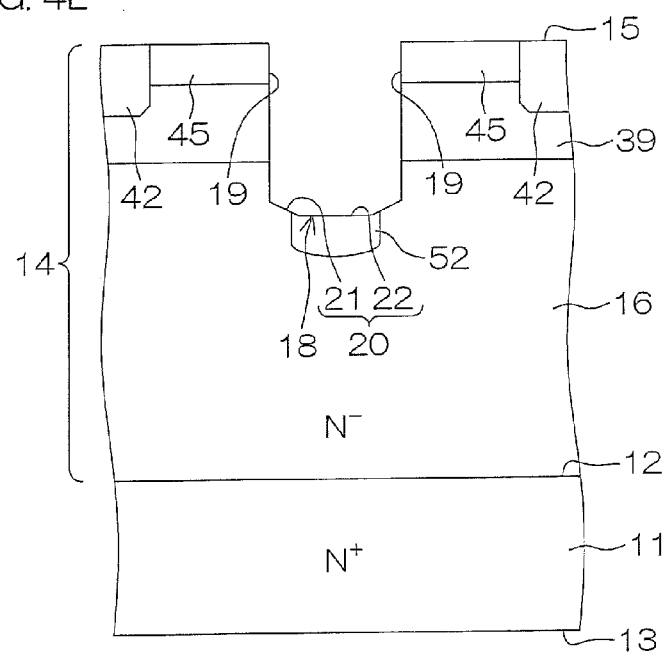
FIG. 4L is a diagram showing a step subsequent to FIG. 4K.

Then, the trench protective mask 51 made of polysilicon is removed by wet etching, and the trench forming mask 46 made of $SiO_2$ and the stopper film 48 are removed, as shown in FIG. 4L.

Figure 4M:
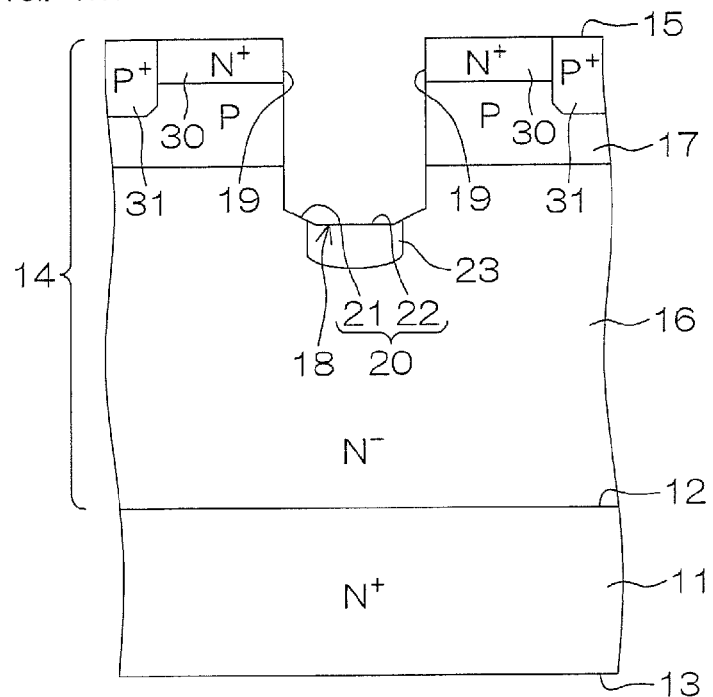
FIG. 4M is a diagram showing a step subsequent to FIG. 4L.

Then, the epitaxial layer 14 is heat-treated at 1400° C. to 1900° C., for example, as shown in FIG. 4M. Thus, the implanted P-type and N-type impurities are activated, whereby the body regions 17 are formed on side portions of the gate trench 18, while the source regions 30 and the body contact regions 31 are formed on surface layer portions of the body regions 18. Due to the heat treatment, further, the P-type impurity in the implantation layer 52 is activated, and the implantation layer forms the implantation active layer 23 provided with conductivity.

Figure 4N:
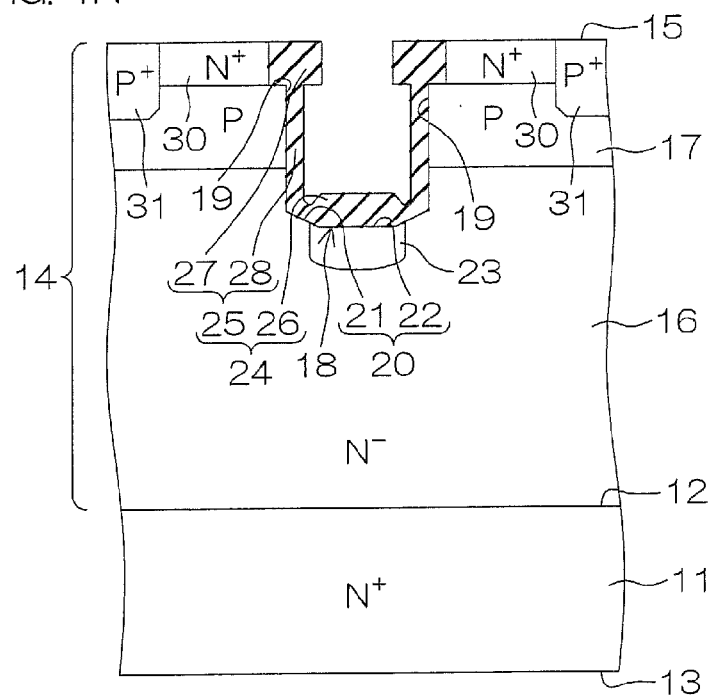
FIG. 4N is a diagram showing a step subsequent to FIG. 4M.

Then, the inner surfaces (the side surfaces 19 and the bottom surface 20) of the gate trench 18 are oxidized by thermal oxidation (Dry oxidation) employing $O_2$ gas, as shown in FIG. 4N. The implantation active layer 23 having a prescribed depth from the bottom surface 20 of the gate trench 18 is formed, and hence the oxidation of the inner surfaces of the gate trench 18 progresses under the condition that the rate of oxidation of the parallel portion 22 where the implantation active layer 23 is exposed and the rate of oxidation of the side surfaces 19 where regions maintaining the state after the epitaxy are exposed satisfy a relational expression: rate of oxidation of parallel portion 22/rate of oxidation of side surfaces 19=1.5 to 2.0>1, for example. Thus, the gate insulating film 24 in which the thickness of the insulating film bottom portion 26 is greater than the thickness of the insulating film side portions 25 is formed.

On the other hand, the body regions 17 and the source regions 30 having different impurity concentrations are exposed from the side surfaces 19 of the gate trench 18, and hence the oxidation of the side surfaces 19 of the gate trench 18 progresses under the condition that the rate of oxidation of the portions where the source regions 30 are exposed and the rate of oxidation of portions where the remaining portions in the epitaxial layer 14 are exposed satisfy a relational expression: rate of oxidation of portions of source regions 30/rate of oxidation of remaining portions=1.0 to 3.0>1, for example. Thus, the insulating film side portions 25 in which the thickness of the source adjacent portions 27 is greater than the thickness of the body adjacent portions 28 are formed.

Figure 4O:
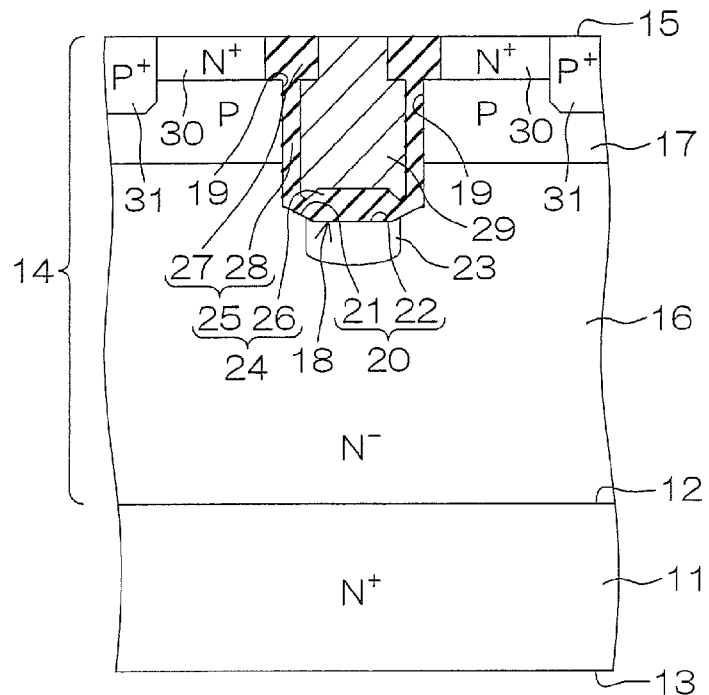
FIG. 4O is a diagram showing a step subsequent to FIG. 4N.

Then, a doped polysilicon material is deposited on the epitaxial layer 14 by CVD, as shown in FIG. 4O. The deposited polysilicon material is etched back until an etch-back surface is flush with the surface 15 of the epitaxial layer. Thus, portions of the polysilicon material out of the gate trench 18 are removed, and the gate electrode 29 made of the polysilicon material remaining in the gate trench 18 is formed.

Figure 4P:
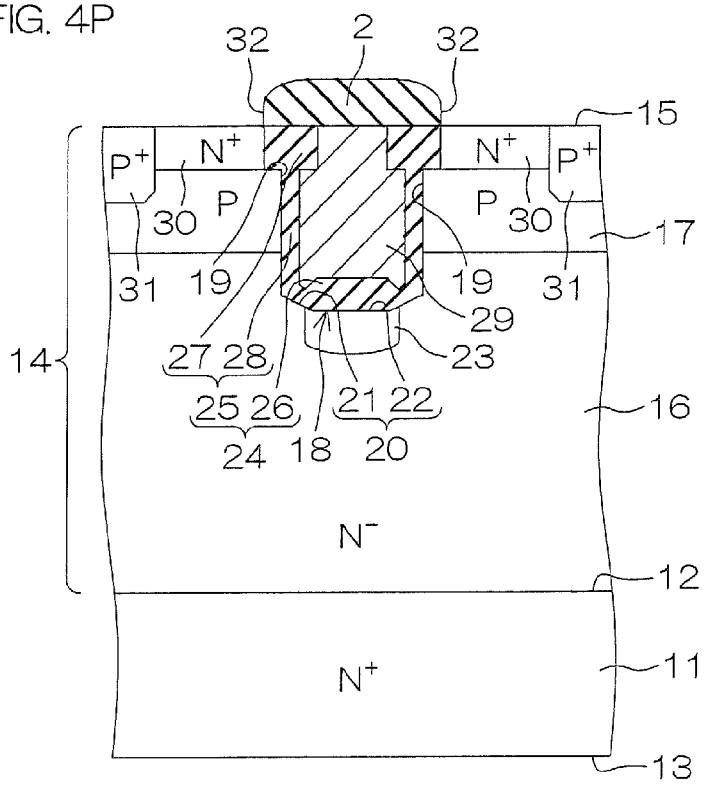
FIG. 4P is a diagram showing a step subsequent to FIG. 4O.

Then, the interlayer dielectric film 2 made of $SiO_2$ is stacked on the epitaxial layer 14 by CVD, as shown in FIG. 4P. Then, the interlayer dielectric film 2 is patterned, whereby the contact holes 32 exposing the source regions 30 and the body contact regions 31 are formed in the interlayer dielectric film 2.

Then, Ni is deposited on the epitaxial layer 14 by sputtering, as shown in FIG. 4Q. Then, after portions excluding portions on the source regions 30 and the body contact regions 31 are lifted off, and RTA (Rapid Thermal Annealing) annealing of 1000° C., for example, is performed. Thus, Ni is silicified by reacting Si in SiC and Ni with each other, and the nickel silicide layers 33 are formed. Thereafter a metal (Al or the like) is deposited on the nickel silicide layers 33 by sputtering. Thus, the metal layer 34 is formed, and the source electrode 3 is formed.

Then, the gate wire 38 connected to the gate electrode 29 is formed. Thereafter the drain electrode 35 having the nickel silicide layer 36 and the metal layer 37 is formed on the back surface 13 of the SiC substrate 11 by a method similar to that for the source electrode 3.

The semiconductor device 1 shown in FIG. 3 is obtained through the aforementioned steps.

Thus, according to the aforementioned manufacturing method, the implantation active layer 23 exposed on the parallel portion 22 of the bottom surface 20 is formed in advance of the oxidation of the inner surfaces (the side surfaces 19 and the bottom surface 20) of the gate trench 18 (see FIG. 4M). Therefore, the oxidation of the inner surfaces of the gate trench 18 after the formation of the implantation active layer 23 progresses under the condition that the rate of oxidation of the parallel portion 22 and the rate of oxidation of the side surfaces 19 where the regions maintaining the state after the epitaxy are exposed satisfy the relational expression: rate of oxidation of parallel portion 22/rate of oxidation of side surfaces 19=1.5 to 2.0>1, for example. Consequently, the gate insulating film 24 in which the thickness $T_3$ of the insulating film bottom portion 26 is greater than the thickness $T_2$ of the body adjacent portions 28 can be formed.

In the semiconductor device 1, therefore, dielectric breakdown of the insulating film bottom portion 26 can be suppressed while suppressing increase in the thicknesses $T_1$ and $T_2$ of the insulating film side portions 25, by properly designing the thickness $T_3$ of the insulating film bottom portion 26 of the gate insulating film 24.

As an index expressing the switching performance of a trench gate MOSFET, the product $R_{on} \cdot Q$ of on-resistance $R_{on}$ of the MOSFET and a gate charge quantity Q is employed, for example. The switching performance is improved as $R_{on} \cdot Q$ is reduced, and hence the gate charge quantity is preferably as small as possible. The gate charge quantity denotes the quantity of charges stored in a capacitance (the source adjacent portions 27 of the gate insulating film 24, for example) parasitically formed on a gate.

In the semiconductor device 1, the thickness $T_1$ of the source adjacent portions 27 is greater than the thickness $T_2$ of the body adjacent portions 28, whereby the distance between the gate electrode 29 and the source regions 30 can be increased. Therefore, the capacitance of the source adjacent portions 27 can be reduced. Consequently, the quantity of charges stored in a parasitic capacitance of a gate can be reduced, whereby the switching performance of the MOSFET can be improved.

Further, the P-type impurity is implanted from the bottom surface 20 of the gate trench 18 into the inner portion of the epitaxial layer 14 in the state where the side surfaces 19 of the gate trench 18 are covered with the trench protective mask 51 (see FIG. 4K). Therefore, implantation of the P-type impurity from the side surfaces 19 of the gate trench 18 into a channel portion of the epitaxial layer 14 can be suppressed.

In addition, the gate trench 18 is formed through the trench forming mask 46 made of $SiO_2$, and the trench protective mask 51 made of polysilicon is formed in the state leaving the trench forming mask 46 (see FIG. 4I). $SiO_2$ and polysilicon have different etching rates with respect to an etchant or etching gas. Therefore, the trench forming mask 46 can be utilized as an etching stopper when etching the trench protective mask 51.

In the step (see FIG. 4J) of etching back the portion (the portion on the stopper film bottom portion 50) of the trench protective mask 51 on the bottom surface 20, therefore, the progress of the etching on the trench forming mask 46 can be stopped on the trench forming mask 46 at the time when the trench protective mask 51 on the surface 15 of the epitaxial layer 14 is etched along with the portion on the bottom surface 20. Consequently, the surface 15 of the epitaxial layer 14 can be prevented from being corroded.

The implantation layer 52 is formed before the step of forming the body regions 17, the source regions 30 and the body contact regions 31 by the heat treatment, whereby the P-type impurity in the implantation layer 52 can be activated in the heat treatment. Thus, the implantation layer 52 can be formed as the implantation active layer 23 provided with the conductivity.

Due to the implantation active layer 23, an energy barrier formed between the implantation active layer 23 and the drain region 16 can be increased. Consequently, a current can be rendered hardly flowable to the implantation active layer 23.

The surface 15 of the epitaxial layer 14 is the Si plane, whereby the bottom surface 20 (the parallel portion 22) of the gate trench 18 can be formed by an Si plane. The rate of oxidation of an Si plane is faster than the rate of oxidation of a C plane in an SiC semiconductor crystal, whereby the rate of oxidation of the bottom surface 20 (the parallel portion 22) of the gate trench 18 can be further increased when the bottom surface 20 (the parallel portion 22) of the gate trench 18 is the Si plane. Therefore, the thickness of the gate insulating film 24 (the insulating film side portions 25) on the side surfaces 19 of the gate trench 18 can be prevented from exceeding a necessary level at the time when the gate insulating film 24 (the insulating film bottom portion 26) of a desired thickness is formed on the bottom surface 20 (the parallel portion 22) of the gate trench 18. If the bottom surface 20 (the parallel portion 22) of the gate trench 18 is a C plane, on the other hand, the thickness of the gate insulating film on the side surfaces 19 of the gate trench 18 may exceed the necessary level at the time when the gate insulating film of the desired thickness is formed on the bottom surface 20 (the parallel portion 22) of the gate trench 18. Consequently, there is an apprehension that that the gate insulating film is too thick to form a channel even if a gate threshold voltage is applied to the gate electrode 29.

Further, the bottom surface 20 of the gate trench 18 has the inclined portions 21 on both end portions of the side surfaces 19 opposed to each other at an interval in the opposed direction, whereby electric field concentration on both end portions of the bottom surface 20 of the gate trench 18 can be suppressed when the semiconductor device 1 is turned off.

FIG. 5 is a schematic sectional view of a semiconductor device according to a second embodiment of the present invention. Referring to FIG. 5, portions corresponding to the respective portions shown in FIG. 3 are denoted by the same reference numerals as the reference numerals assigned to the respective portions. In the following, detailed description as to the portions denoted by the same reference numerals is omitted.

In a semiconductor device 53, the manufacturing method therefor is different from the manufacturing method for the semiconductor device 1, and hence the distance (the distance between a pair of side surfaces 19) in a direction orthogonal to a gate width of a gate trench 18 is different from the same distance in the semiconductor device 1, and 0.8 µm to 1.3 µm, for example.

The remaining structure is similar to the aforementioned case of the first embodiment, and operations are also similar.

Figure 6A:
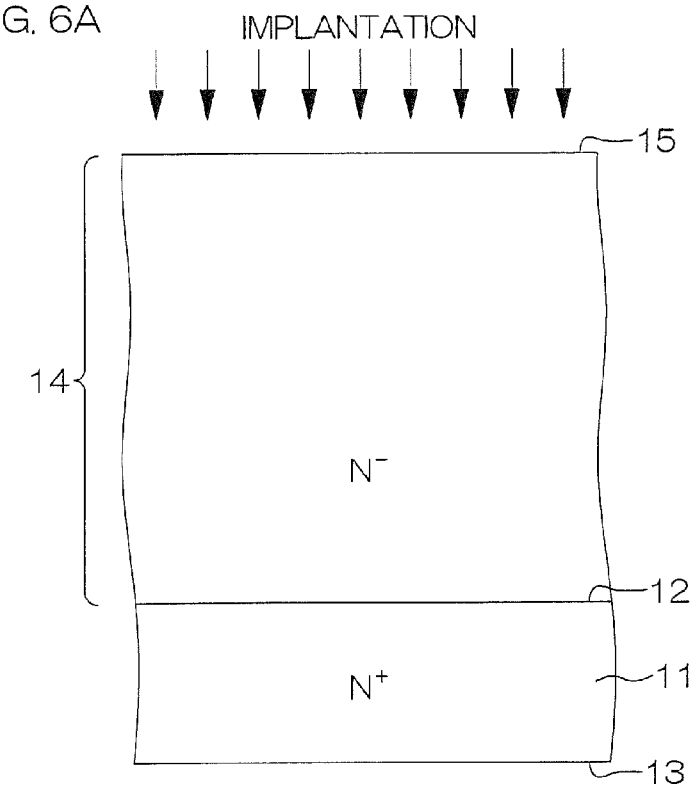
FIG. 6A is a schematic sectional view for illustrating a method of manufacturing the semiconductor device shown in FIG. 5.
Figure 6B:
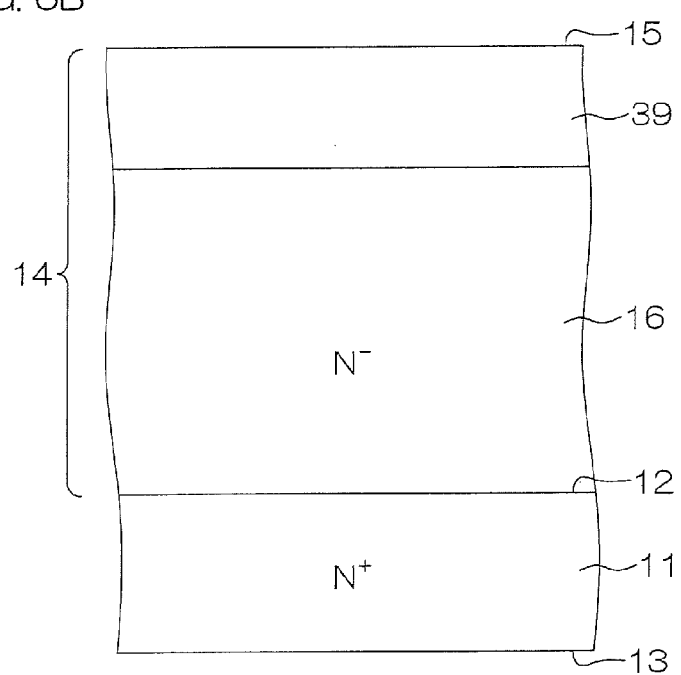
FIG. 6B is a diagram showing a step subsequent to FIG. 6A.
Figure 6E:
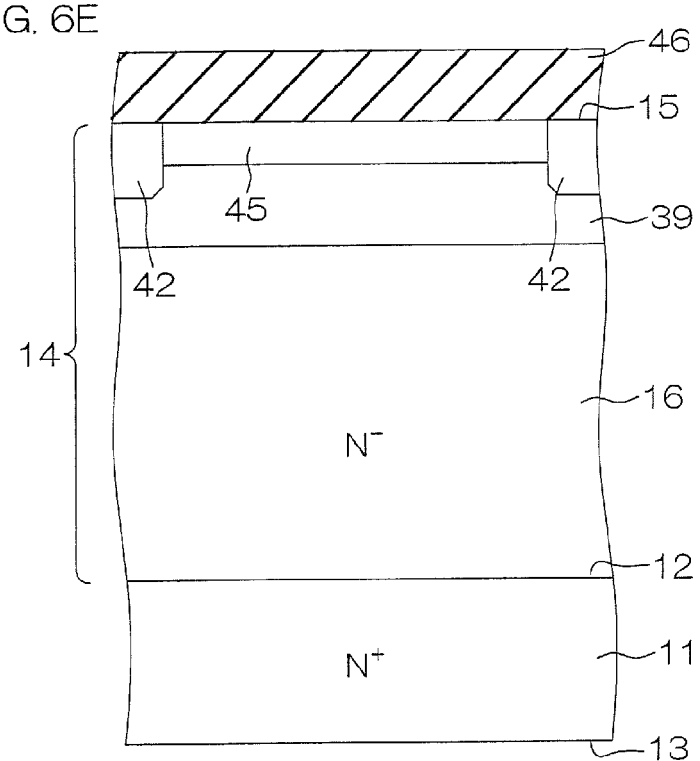
FIG. 6E is a diagram showing a step subsequent to FIG. 6D.
Figure 6F:
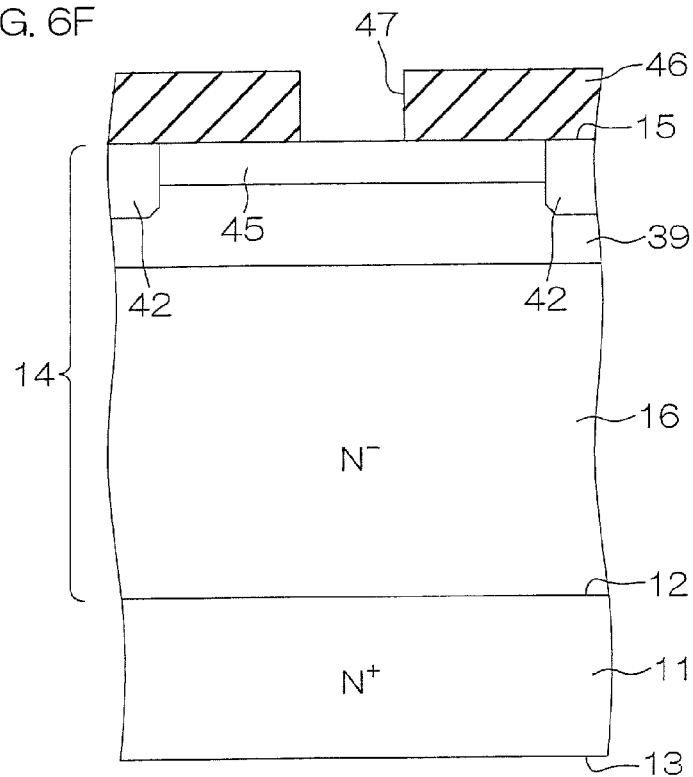
FIG. 6F is a diagram showing a step subsequent to FIG. 6E.
Figure 6G:
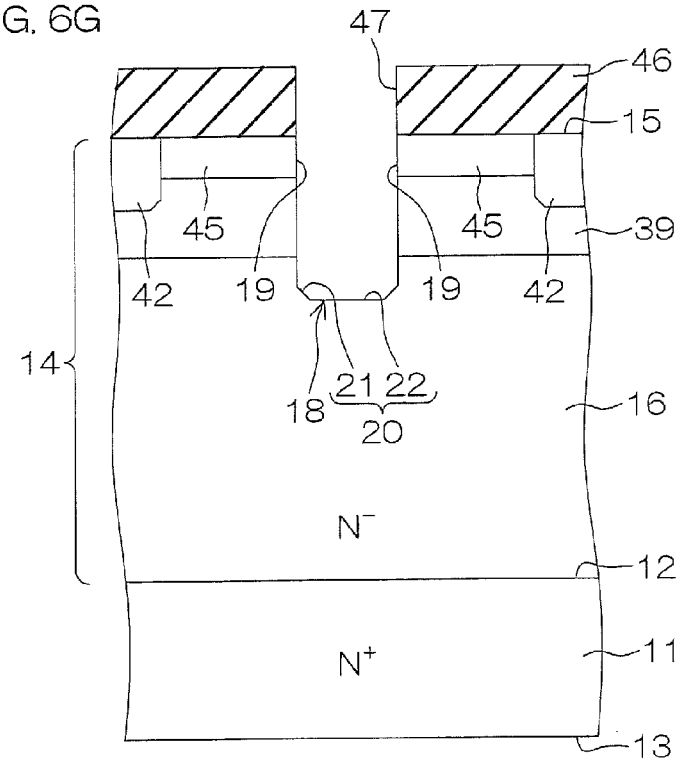
FIG. 6G is a diagram showing a step subsequent to FIG. 6F.

FIGS. 6A to 6O are schematic sectional views for illustrating the manufacturing method for the semiconductor device shown in FIG. 5.

First, steps similar to FIGS. 4A to 4G are carried out as shown in FIGS. 6A to 6G, and the gate trench 18 is formed in an epitaxial layer 14.

Figure 6H:
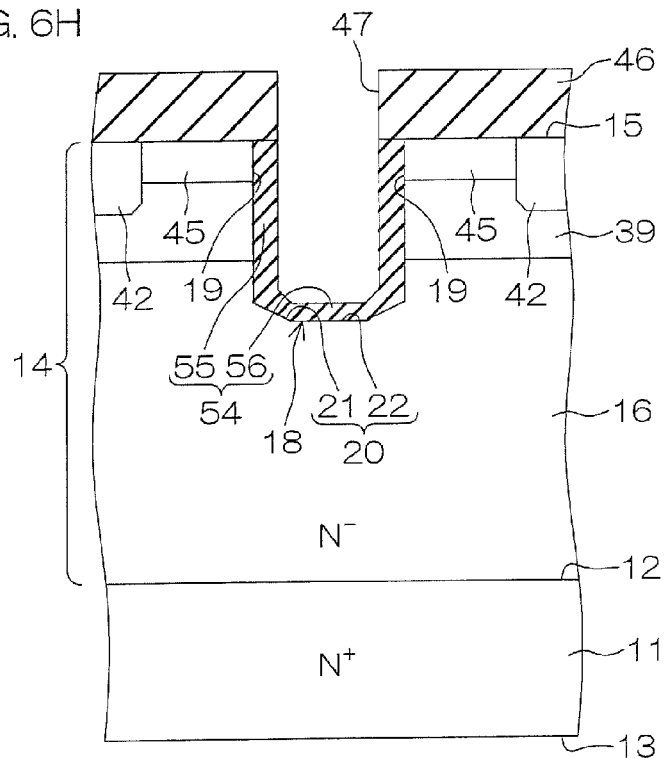
FIG. 6H is a diagram showing a step subsequent to FIG. 6G.

Then, the inner surfaces (the side surfaces 19 and a bottom surface 20) of the gate trench 18 are oxidized by thermal oxidation (Dry oxidation) employing $O_2$ gas, as shown in FIG. 6H. The $O_2$ gas is supplied for a time longer than the supply time at the time of forming the stopper film 48 in the first embodiment, at 1200° C. for 3 hours to 5 hours, for example.

The gate trench 18 is formed in the epitaxial layer 14 made of SiC, whereby the oxidation of the inner surfaces of the gate trench 18 progresses under the condition that the rate of oxidation of a parallel portion 22 which is an Si plane and the rate of oxidation of the side surfaces 19 which are planes orthogonal to the Si plane satisfy a relational expression: rate of oxidation of parallel portion 22/rate of oxidation of side surfaces 19=0.1 to 0.2<1, for example. Thus, a trench protective film 54 (a silicon oxide film) in which the thickness of a portion (a protective film bottom portion 56) on the bottom surface 20 (the parallel portion 22) is smaller than the thickness of portions (protective film side portions 55) on the side surfaces 19 is formed.

The ratio (thickness of protective film bottom portion 56/thickness of protective film side portions 56) of the thickness of the protective film bottom portion 56 to the thickness of the protective film side portions 55 formed in such a manner is 0.1 to 0.2, for example. As to the specific sizes of the thicknesses, the thickness of the protective film side portions 55 is 0.1 µm to 0.5 µm, and the thickness of the protective film bottom portion 56 is 0.02 µm to 0.1 µm, for example.

Figure 6I:
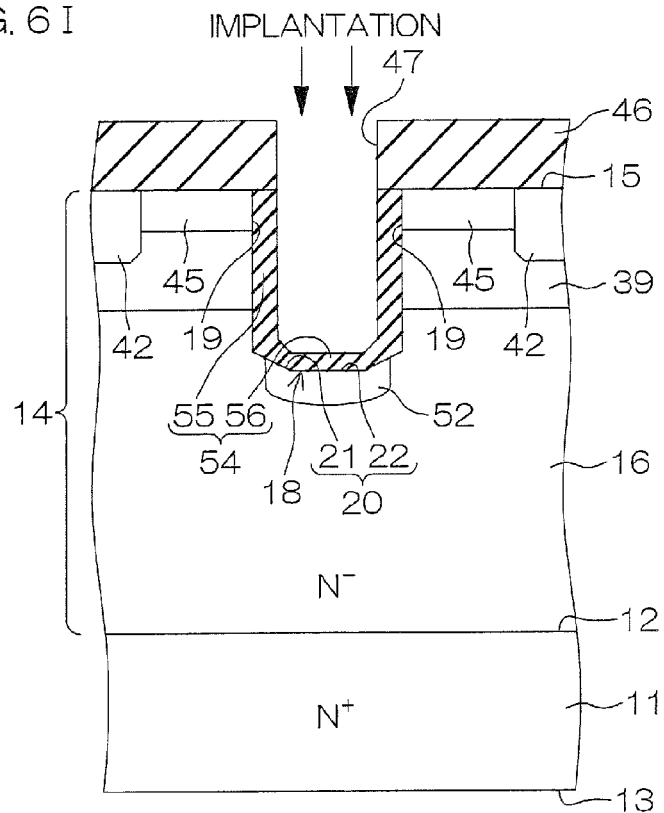
FIG. 6I is a diagram showing a step subsequent to FIG. 6H.

Then, a P-type impurity is implanted from the bottom surface 20 of the gate trench 18 into the inner portion of the epitaxial layer 14 through the protective film bottom portion 56, as shown in FIG. 6I. While the implantation conditions at this time vary with the type of the P-type impurity, acceleration energy is 30 kEV to 180 kEV, for example. Thus, an implantation layer 52 is formed in the epitaxial layer 14 in a portion extending from the bottom surface 20 of the gate trench 18 to an intermediate portion in the thickness direction thereof.

Figure 6J:
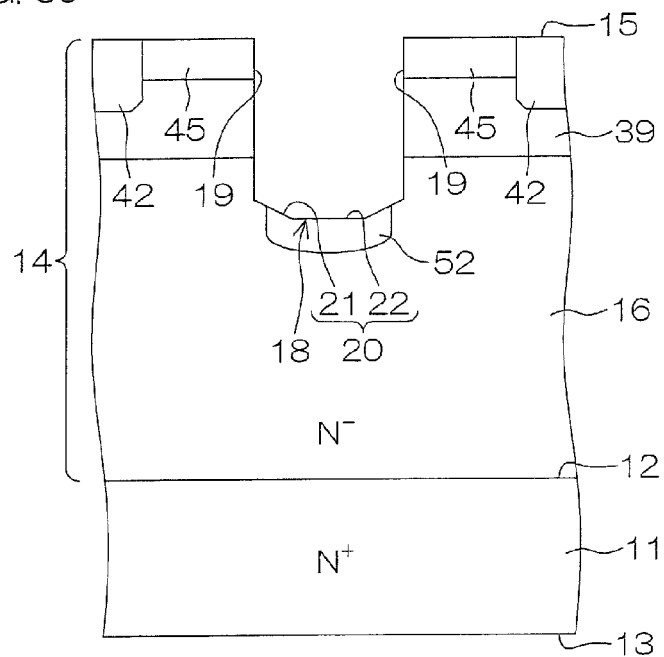
FIG. 6J is a diagram showing a step subsequent to FIG. 6I.
Figure 6K:
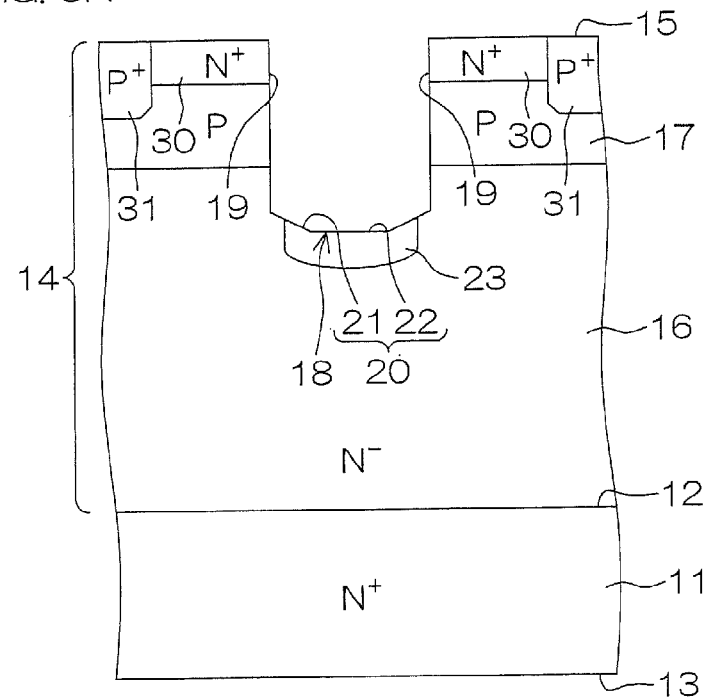
FIG. 6K is a diagram showing a step subsequent to FIG. 6J.
Figure 6L:
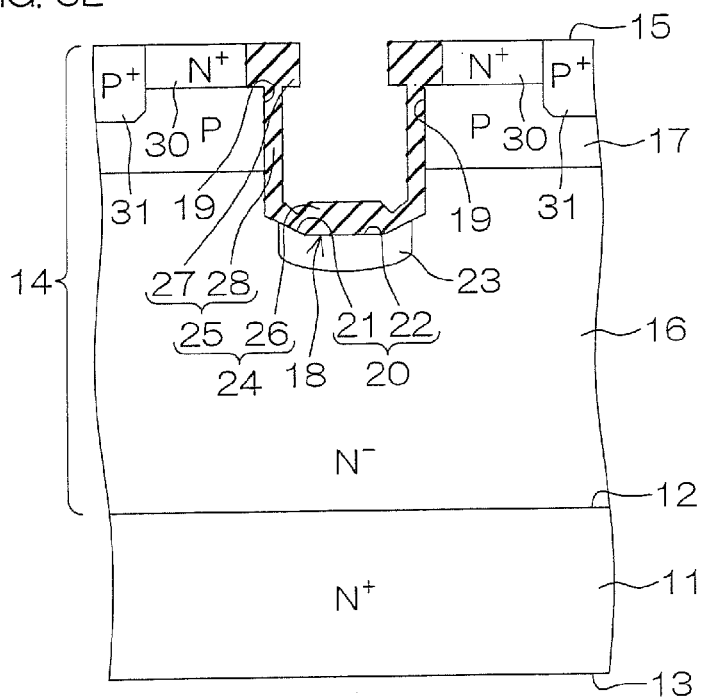
FIG. 6L is a diagram showing a step subsequent to FIG. 6K.
Figure 6M:
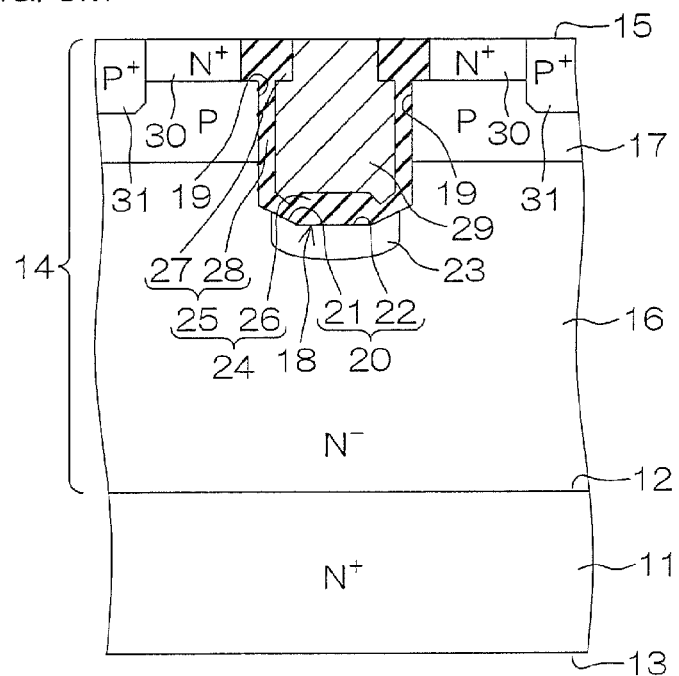
FIG. 6M is a diagram showing a step subsequent to FIG. 6L.
Figure 6N:
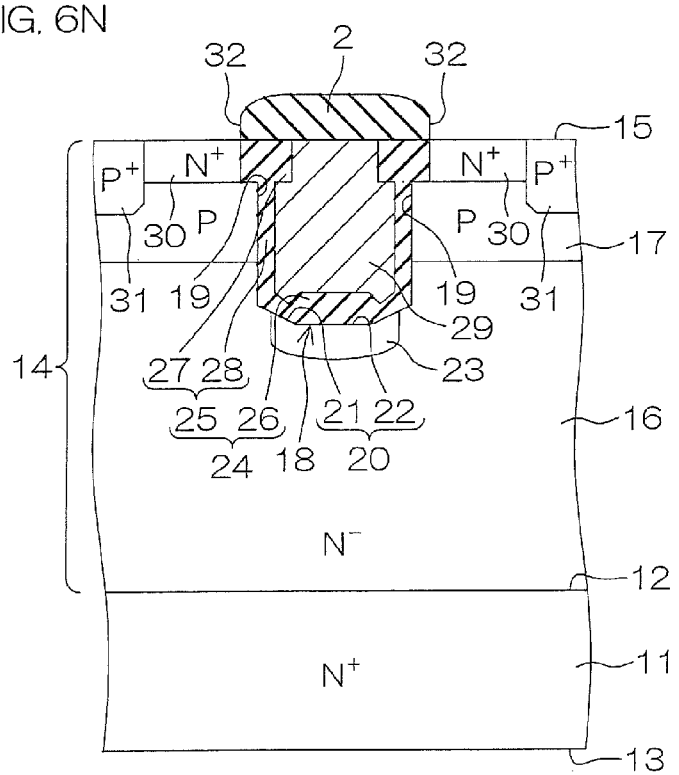
FIG. 6N is a diagram showing a step subsequent to FIG. 6M.
Figure 60:
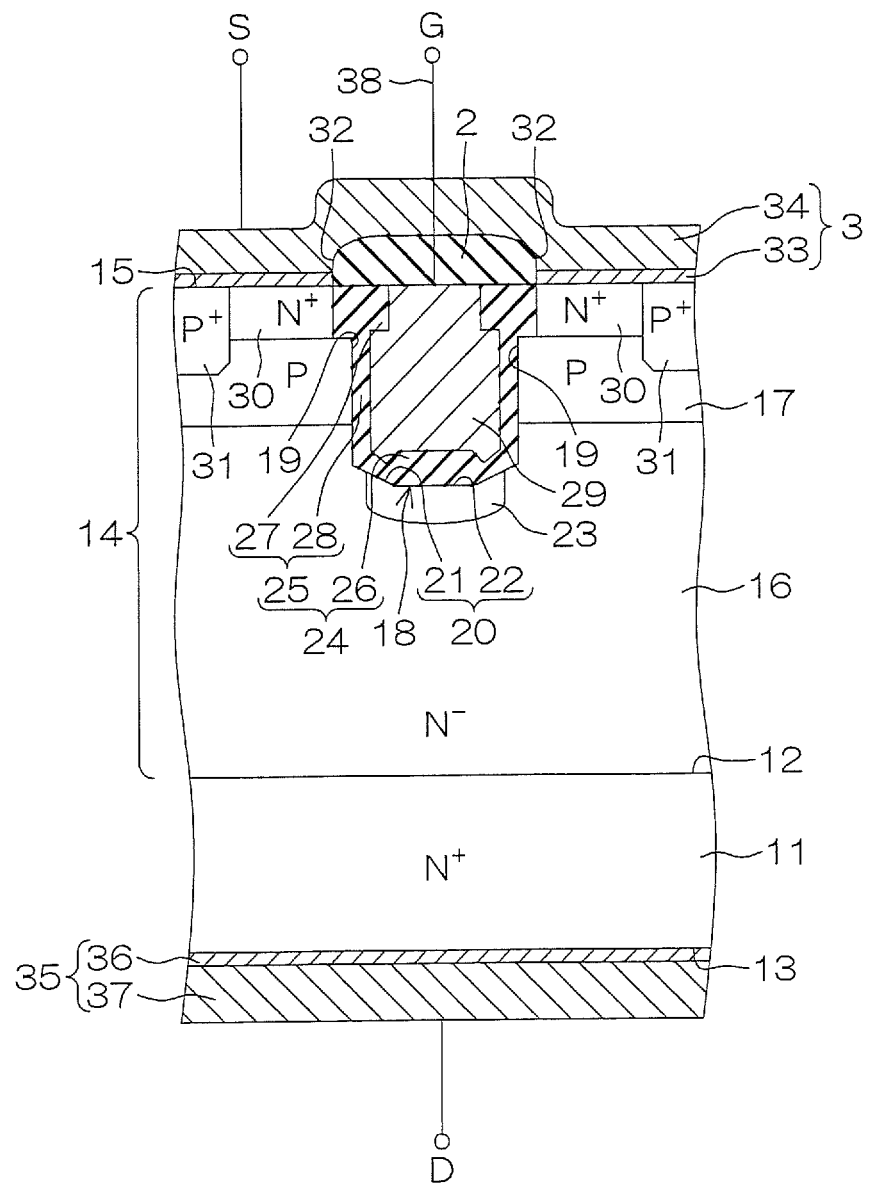

Then, a trench forming mask 46 made of $SiO_2$ and a trench protective film 54 are removed by wet etching, as shown in FIG. 6J.

Thereafter steps similar to FIGS. 4M to 4Q are carried out as shown in FIGS. 6K to 6O, and the semiconductor device 53 shown in FIG. 5 is obtained.

Thus, the bottom surface 20 of the gate trench 18 has the parallel portion 22 (the Si plane) parallel to a surface 15 (an Si plane) of the epitaxial layer 14. Therefore, the oxidation of the inner surfaces of the gate trench 18 before the formation of the implantation layer 52 progresses under the condition that the rate of oxidation of the parallel portion 22 and the rate of oxidation of the side surfaces 19 which are planes orthogonal to the Si plane satisfy the relational expression: rate of oxidation of parallel portion 22/rate of oxidation of side surfaces 19=0.1 to 0.2<1, for example. Consequently, the trench protective film 54 in which the thickness of the portion (the protective film bottom portion 56) on the parallel portion 22 is smaller than the thickness of the portions (the protective film side portions 55) on the side surfaces 19 can be formed.

Therefore, implantation of the P-type impurity from the side surfaces 19 of the gate trench 18 can be efficiently suppressed while enabling implantation of the P-type impurity from the bottom surface 20 of the gate trench 18 in the implantation of the P-type impurity for forming the implantation 52, by forming the trench protective film 54 under a proper oxidation condition.

As to other functions and effects similar to those of the first embodiment, description is omitted.

FIG. 7 is a schematic sectional view of a semiconductor device according to a third embodiment of the present invention.

In a semiconductor device 57, an implantation layer 58 formed by implantation of a P-type impurity is formed in a portion of a drain region 16 extending from a bottom surface 20 of a gate trench 18 to an intermediate portion in the thickness direction thereof. The implantation layer 58 is provided to be in contact with generally the whole area of a parallel portion 22 of the bottom surface 20, and the depth thereof is 0.1 µm to 0.5 µm, for example, and preferably 0.2 µm to 0.3 µm. In this embodiment, the depth of the implantation layer 58 is 0.3 µm.

The implantation layer 58 is an insulating layer maintaining an inactive state of the P-type impurity after the implantation, and a high-resistance layer having a higher resistance value than the implantation active layer 23 in FIG. 3. The resistance value of the implantation layer 58 is several k$\Omega$/☐ to several T(tera)$\Omega$/☐, for example. The P-type impurity concentration in the implantation layer 58 is $1\times10^{18}$ cm$^{-3}$ to $1\times10^{21}$ cm$^{-3}$, for example, and preferably $1\times10^{19}$ cm$^{-3}$ to $1\times10^{20}$ cm$^{-3}$. In this embodiment, the P-type impurity contained in the implantation layer 58 is B (boron), and the concentration thereof is $1\times10^{20}$ cm$^{-3}$.

The remaining structure is similar to the aforementioned case of the first embodiment, and operations are also similar.

Figure 8A:
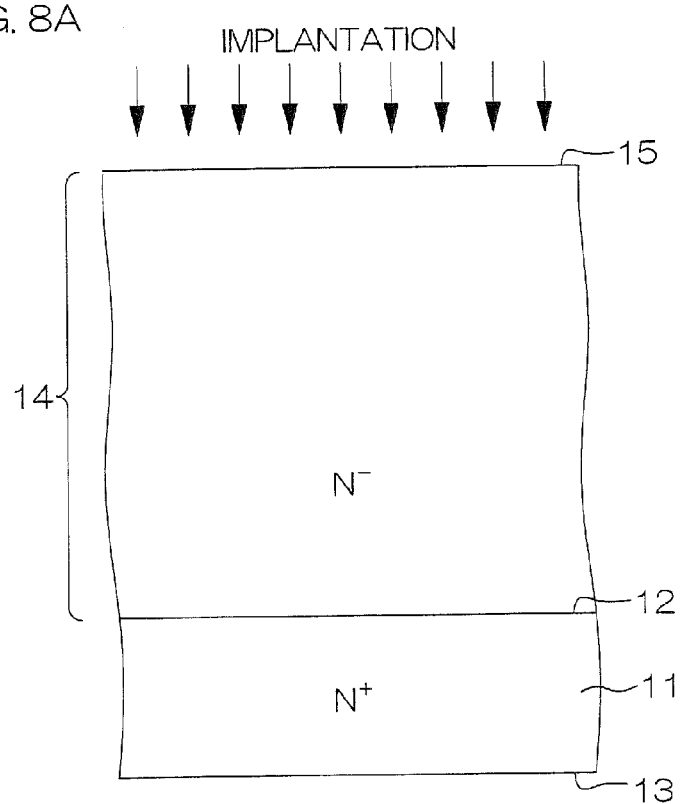
FIG. 8A is a schematic sectional view for illustrating a method of manufacturing the semiconductor device shown in FIG. 7.
Figure 8B:
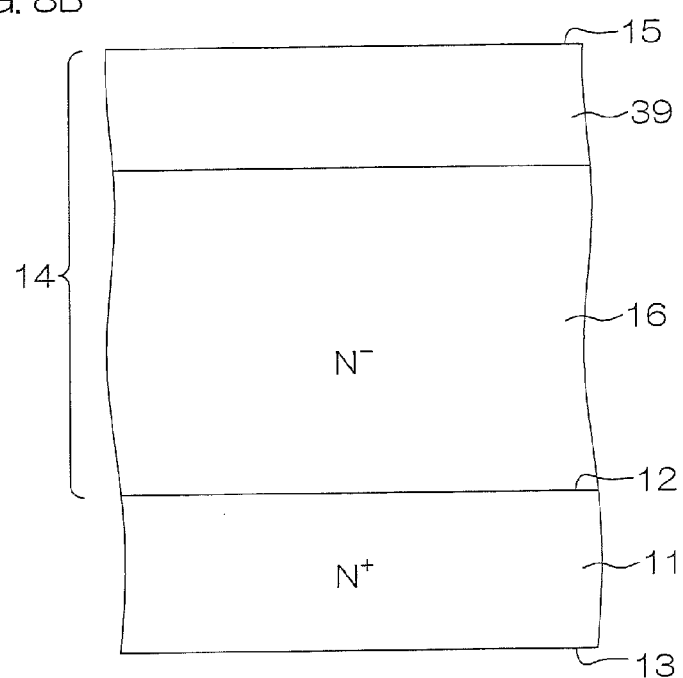
FIG. 8B is a diagram showing a step subsequent to FIG. 8A.
Figure 8C:
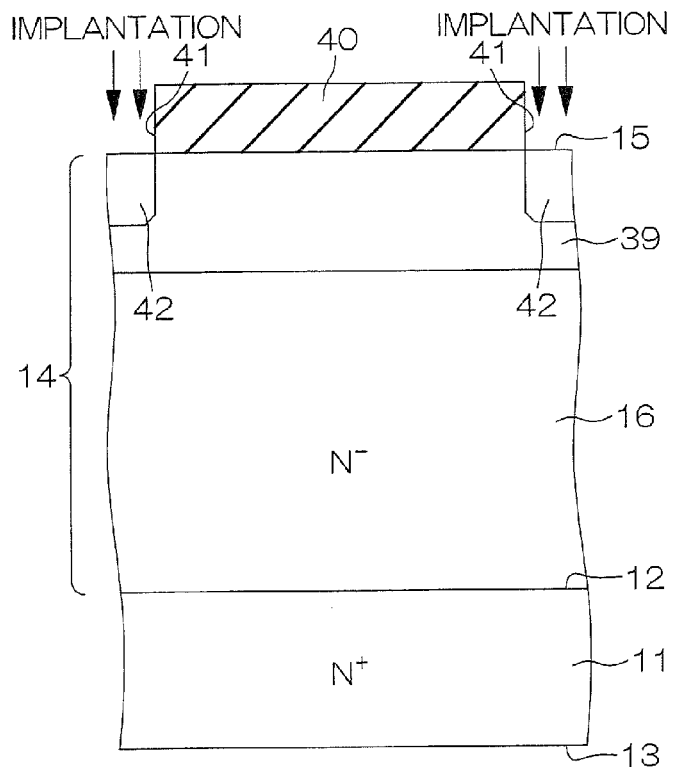
FIG. 8C is a diagram showing a step subsequent to FIG. 8B.
Figure 8D:
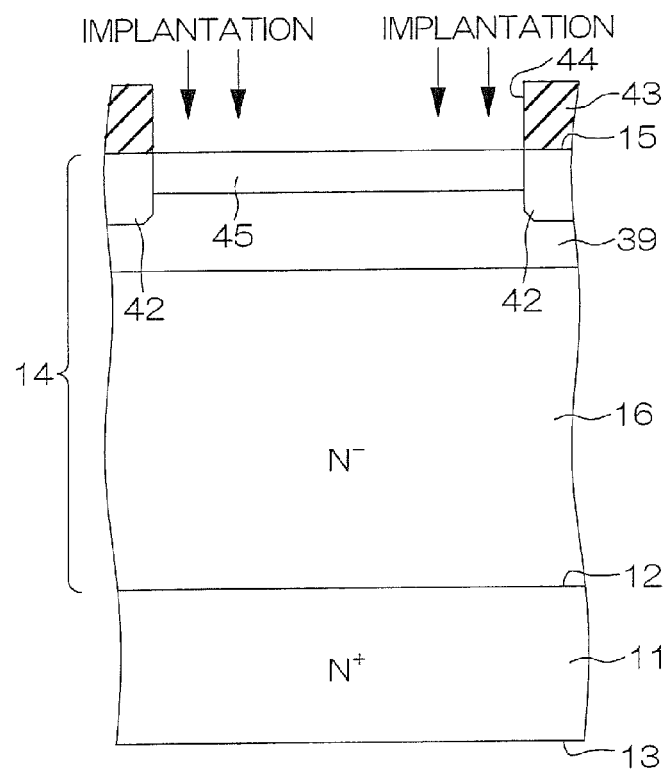
FIG. 8D is a diagram showing a step subsequent to FIG. 8C.

FIGS. 8A to 8Q are schematic sectional views for illustrating a method of manufacturing the semiconductor device shown in FIG. 7.

First, steps similar to FIGS. 4A to 4D are carried out as shown in FIGS. 8A to 8D, and an N$^+$-type implantation region 45 is formed on a surface layer portion of a P-type implantation region 39.

Figure 8E:
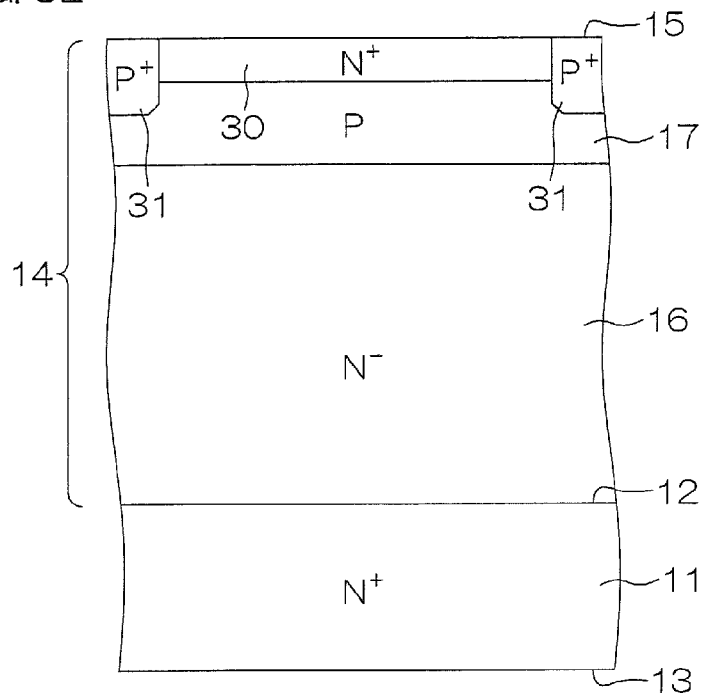
FIG. 8E is a diagram showing a step subsequent to FIG. 8D.

Then, an epitaxial layer 14 is heat-treated at 1400° C. to 1900° C., for example, as shown in FIG. 8E. Thus, implanted P-type and N-type impurities are activated, and body regions 17 are formed on side portions of the gate trench 18, while source regions 30 and body contact regions 31 are formed on surface layer portions of the body regions 17.

Figure 8F:
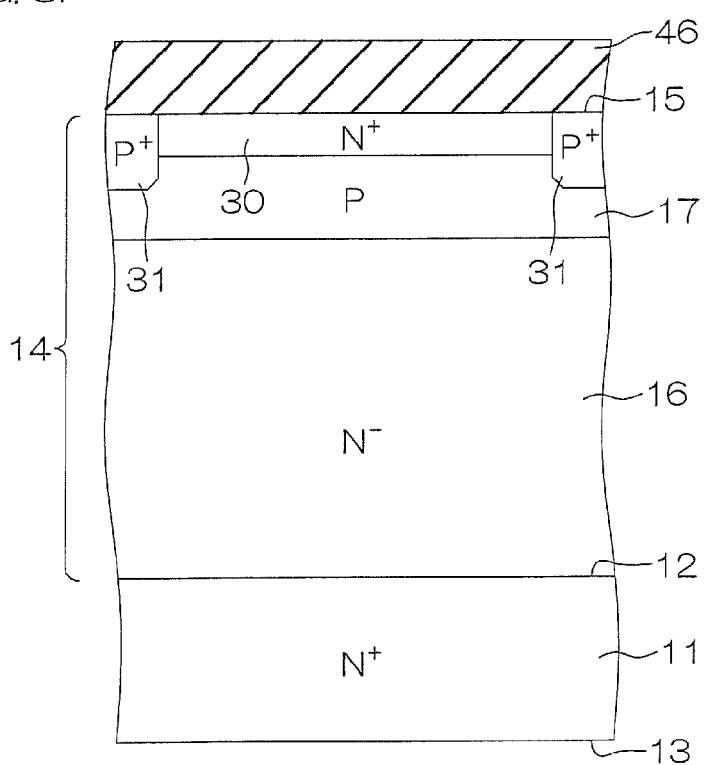
FIG. 8F is a diagram showing a step subsequent to FIG. 8E.

Then, a trench forming mask 46 as a first mask made of $SiO_2$ is formed on the whole area of a surface 15 of the epitaxial layer 14 by CVD, thermal oxidation or the like, as shown in FIG. 8F. The trench forming mask 46 can also be made of SiN or the like, by utilizing CVD.

Figure 8G:
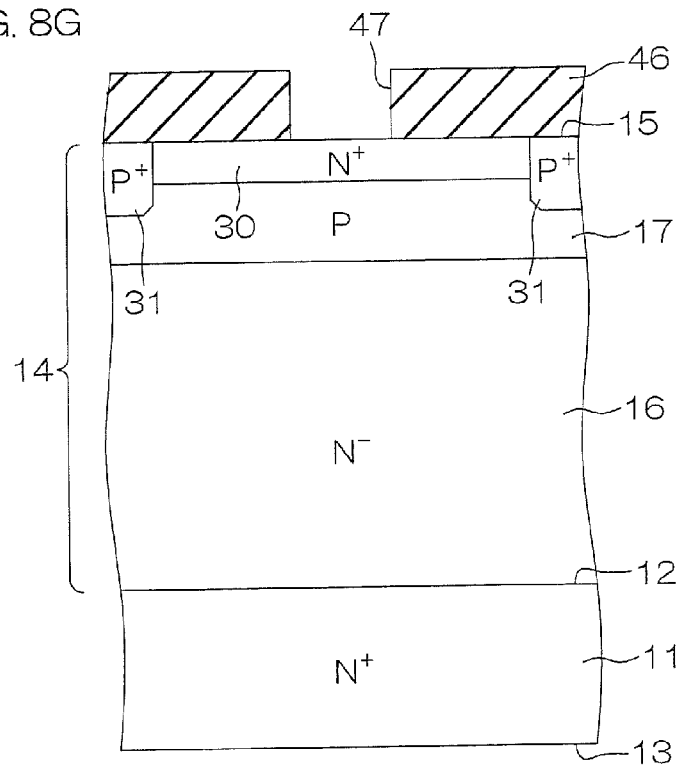
FIG. 8G is a diagram showing a step subsequent to FIG. 8F.

Then, the trench forming mask 46 is etched through a photoresist (not shown), to be patterned into a pattern having an opening 47 in a region for forming the gate trench 18, as shown in FIG. 8G.

Figure 8H:
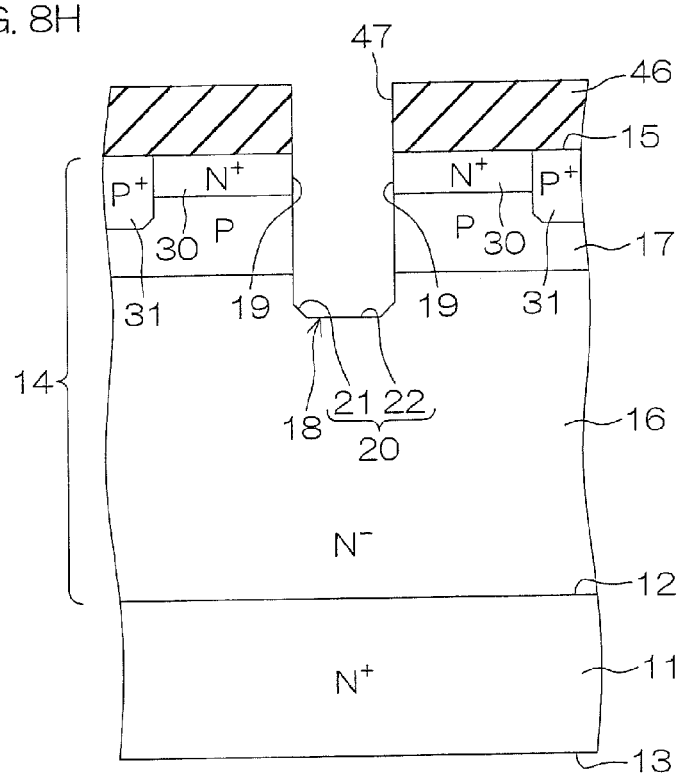
FIG. 8H is a diagram showing a step subsequent to FIG. 8G.

Then, mixed gas ($SF_6/O_2/HBr$ gas) containing $SF_6$ (sulfur hexafluoride), $O_2$ (oxygen) and HBr (hydrogen bromide) is introduced into the surface 15 of the epitaxial layer 14 through the opening 47, as shown in FIG. 8H. Thus, the epitaxial layer 14 is dry-etched from the surface 15 (an Si plane), and the gate trench 18 is formed.

Figure 8I:
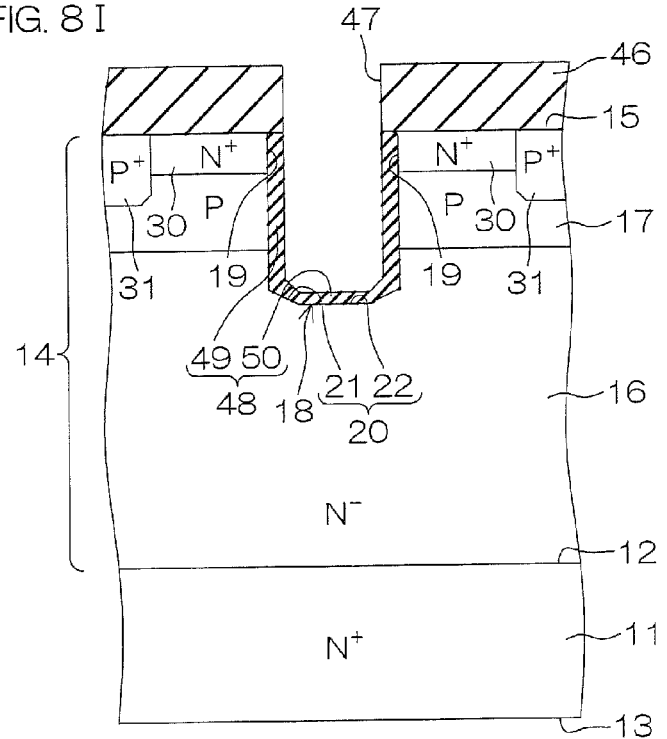
FIG. 8I is a diagram showing a step subsequent to FIG. 8H.

Then, the inner surfaces (side surfaces 19 and a bottom surface 20) of the gate trench 18 are oxidized by thermal oxidation (Dry oxidation) employing $O_2$ gas, as shown in FIG. 8I. The $O_2$ gas is supplied at 1200° C. for 0.5 hours to 1.0 hour, for example. The gate trench 18 is formed in the epitaxial layer 14 made of SiC, and hence the oxidation of the inner surfaces of the gate trench 18 progresses under the condition that the rate of oxidation of the parallel portion 22 which is an Si plane and the rate of oxidation of the side surfaces 19 which are planes orthogonal to the Si plane satisfy a relational expression: rate of oxidation of parallel portion 22/rate of oxidation of side surfaces 19=0.1 to 0.2<1, for example. Thus, a stopper film 48 in which the thickness of a portion (a stopper film bottom portion 50) on the bottom surface 20 (the parallel portion 22) is smaller than the thickness of portions (stopper film side portions 49) on the side surfaces 19 is formed.

Figure 8J:
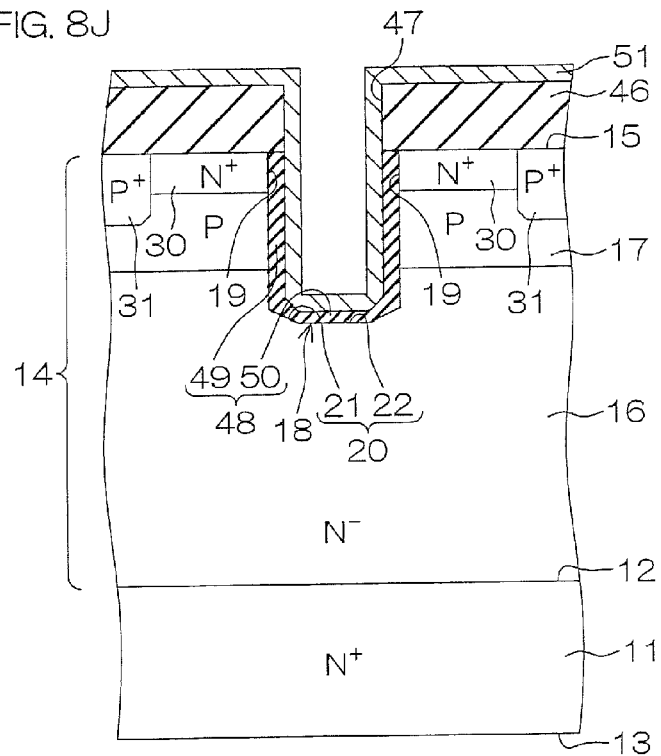
FIG. 8J is a diagram showing a step subsequent to FIG. 8I.

Then, a polysilicon material which is a material different from the material ($SiO_2$) for the trench forming mask 46 is deposited on the epitaxial layer 14 by CVD until the whole area of the surface of the stopper film 48 and the whole area of the surface of the trench forming mask 46 are entirely covered, as shown in FIG. 8J. Thus, a trench protective mask 51 as a second mask is formed on the stopper film 48 and the trench forming mask 46. The thickness of the trench protective mask 51 is controlled to be 0.1 µm to 0.5 for example.

Then, the trench protective mask 51 is etched back from above the epitaxial layer 14, as shown in FIG. 8K. The etchback is continued until the etching stops due to the stopper film bottom portion 50 of the stopper film 48. Thus, portions of the trench protective mask 51 on the stopper film bottom portion 50 and the trench forming mask 46 are removed by the etching, and portions of the trench protective mask 51 on the stopper film side portions 49 remain.

Then, a P-type impurity is implanted from the bottom surface 20 of the gate trench 18 into the inner portion of the epitaxial layer 14 through the stopper film bottom portion 50, as shown in FIG. 8L. While the implantation conditions at this time vary with the type of the P-type impurity, acceleration energy is 30 kEV to 180 kEV, for example. Thus, an implantation layer 58 is formed on a portion of the epitaxial layer 14 extending from the bottom surface 20 of the gate trench 18 to an intermediate portion in the thickness direction thereof.

Figure 8M:
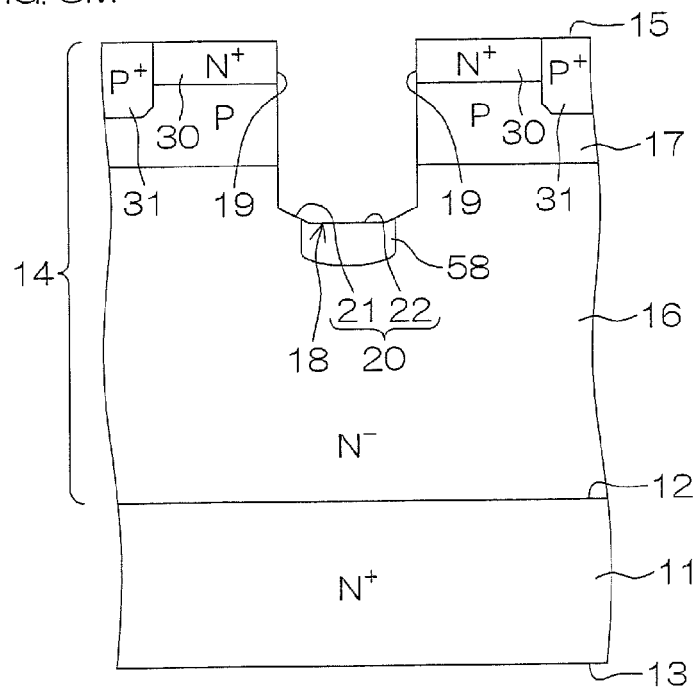
FIG. 8M is a diagram showing a step subsequent to FIG. 8L.
Figure 8N:
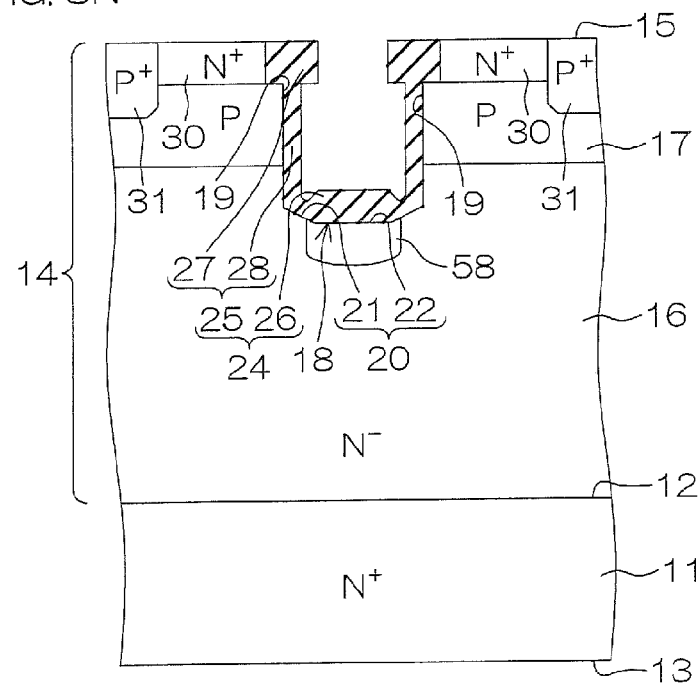
FIG. 8N is a diagram showing a step subsequent to FIG. 8M.
Figure 8O:
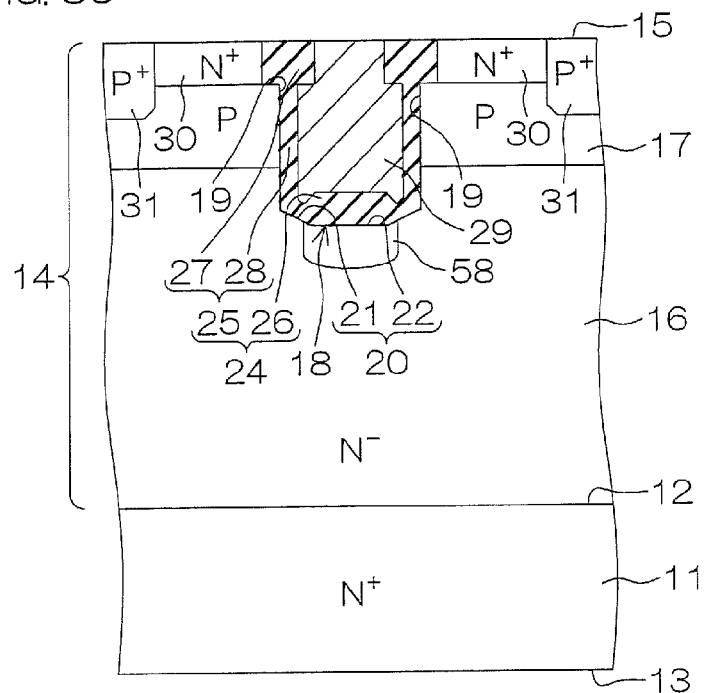
FIG. 8O is a diagram showing a step subsequent to FIG. 8N.
Figure 8P:
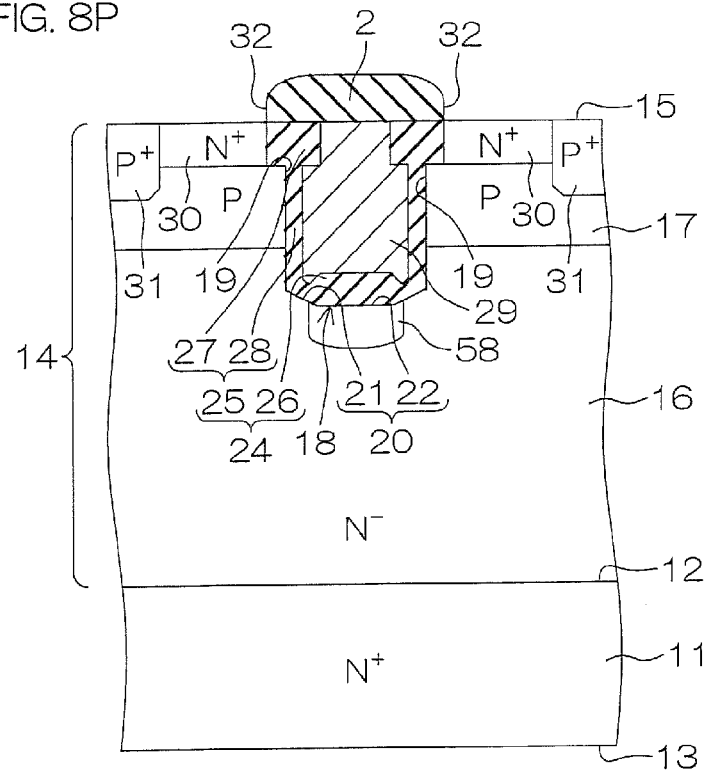
FIG. 8P is a diagram showing a step subsequent to FIG. 8O.

Then, the trench protective mask 51 made of polysilicon is removed by wet etching, and the trench forming mask 46 made of $SiO_2$ and the stopper film 48 are removed, as shown in FIG. 8M.

Thereafter steps similar to FIGS. 4N to 4Q are carried out as shown in FIGS. 8N to 8Q, and the semiconductor device shown in FIG. 7 is obtained.

As hereinabove described, the implantation layer 58 is formed after the step of forming the body regions 17, the source regions 30 and the body contact regions 31 by the heat treatment, whereby the implantation layer 58 is not exposed to the heat treatment in the step of forming these. Therefore, the state of the implantation layer 58 can be maintained in an inactive state of the P-type impurity after the implantation. Thus, the implantation layer 58 can be formed as an insulating layer.

Further, the step (see FIG. 8H) of forming the gate trench 18 is carried out after the step (see FIG. 8E) of forming the body regions 17, the source regions 30 and the body contact regions 31 by the heat treatment. Therefore, the gate trench 18 is not exposed to the heat treatment in the step of forming these. Therefore, deformation or the like of the gate trench 18 by the heat treatment can be prevented. Consequently, the shape of the gate trench 18 can be simply controlled by properly adjusting the etching condition.

As to other functions and effects similar to those of the first embodiment, description is omitted.

FIG. 9 is a schematic sectional view of a semiconductor device according to a fourth embodiment of the present invention. Referring to FIG. 9, portions corresponding to the respective portions shown in FIGS. 3 and 7 are denoted by the same reference numerals as the reference numerals assigned to the respective portions. In the following, detailed description as to the portions denoted by the same reference numerals is omitted.

In a semiconductor device 59, a manufacturing method therefor is different from the manufacturing method for the semiconductor device 57, and hence the distance (the distance between a pair of side surfaces 19) in a direction orthogonal to a gate width of a gate trench 18 is different from the same distance in the semiconductor device 1, and 0.8 µm to 1.3 µm, for example.

The remaining structure is similar to the aforementioned cases of the first and third embodiments, and operations are also similar.

Figure 10A:
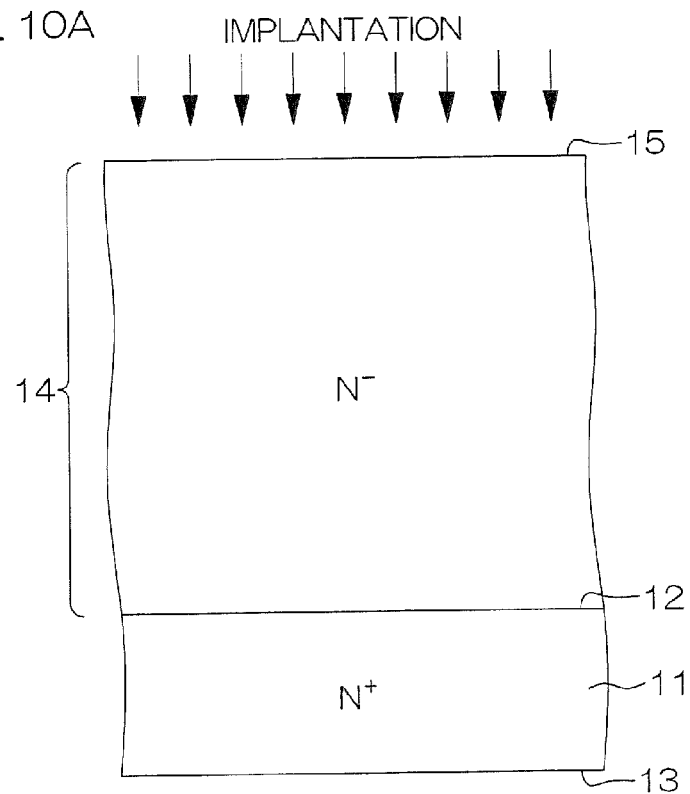
FIG. 10A is a schematic sectional view for illustrating a method of manufacturing the semiconductor device shown in FIG. 9.
Figure 10B:
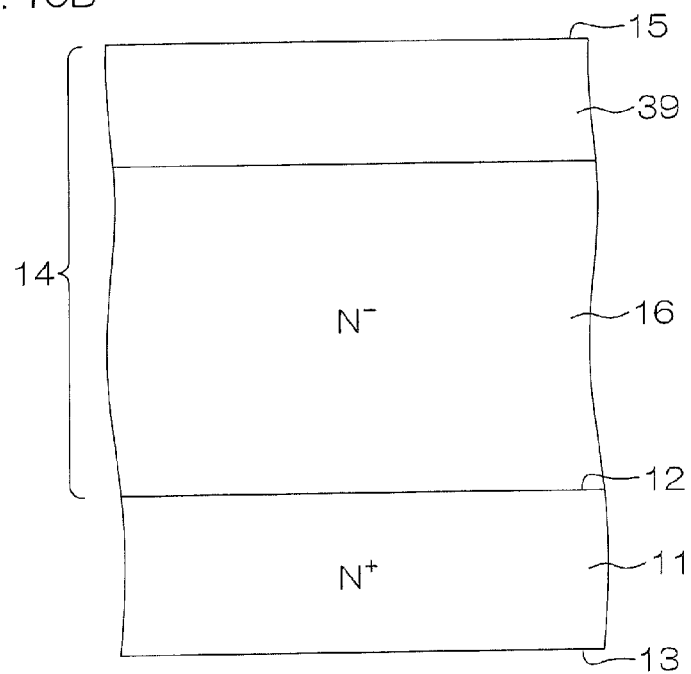
FIG. 10B is a diagram showing a step subsequent to FIG. 10A.
Figure 10C:
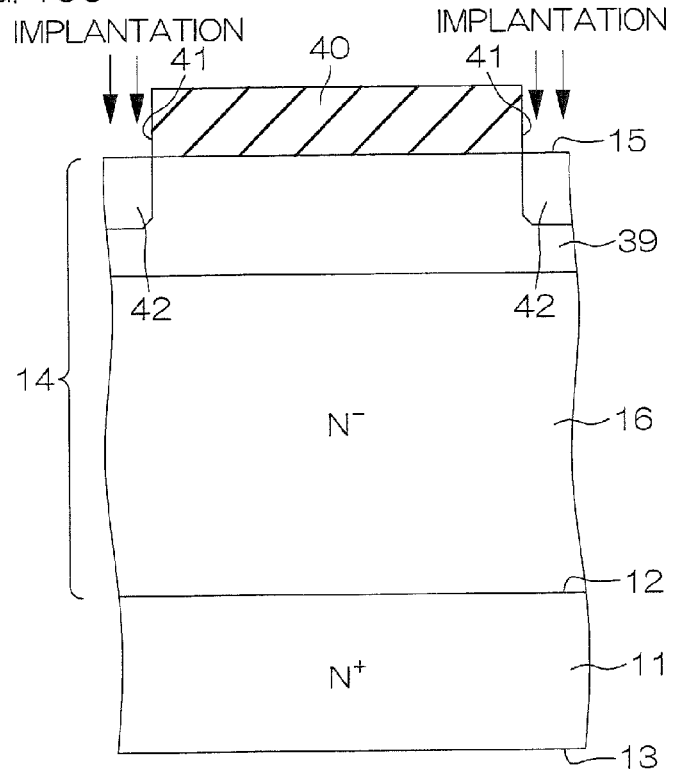
FIG. 10C is a diagram showing a step subsequent to FIG. 10B.
Figure 10D:
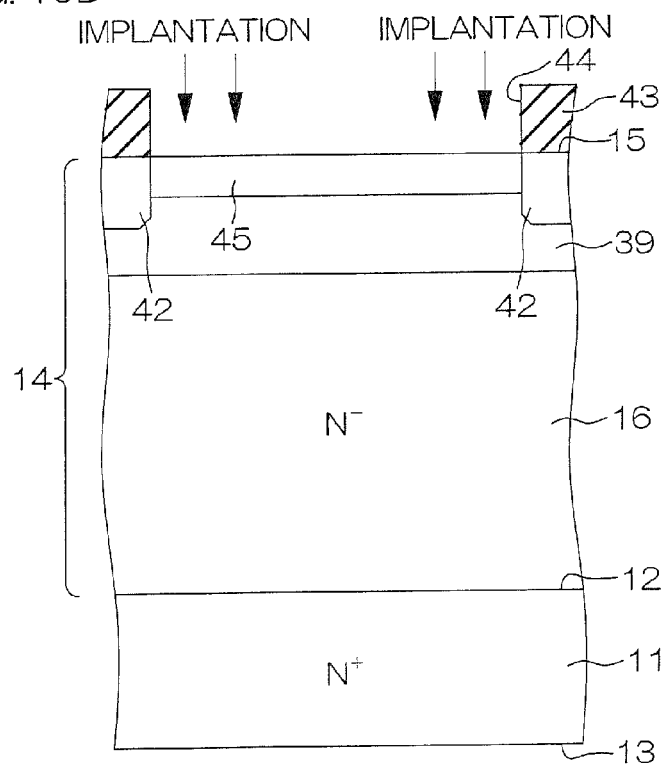
FIG. 10D is a diagram showing a step subsequent to FIG. 10C.
Figure 10E:
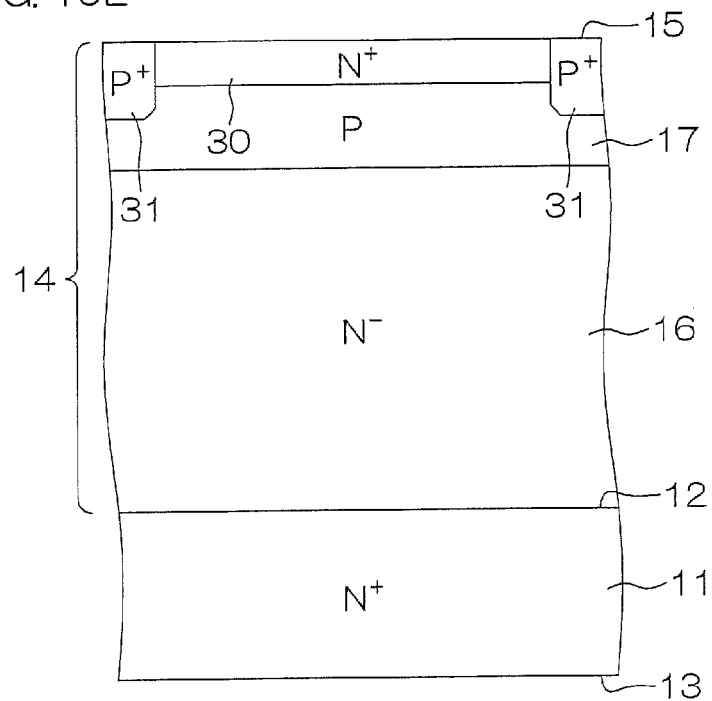
FIG. 10E is a diagram showing a step subsequent to FIG. 10D.
Figure 10F:
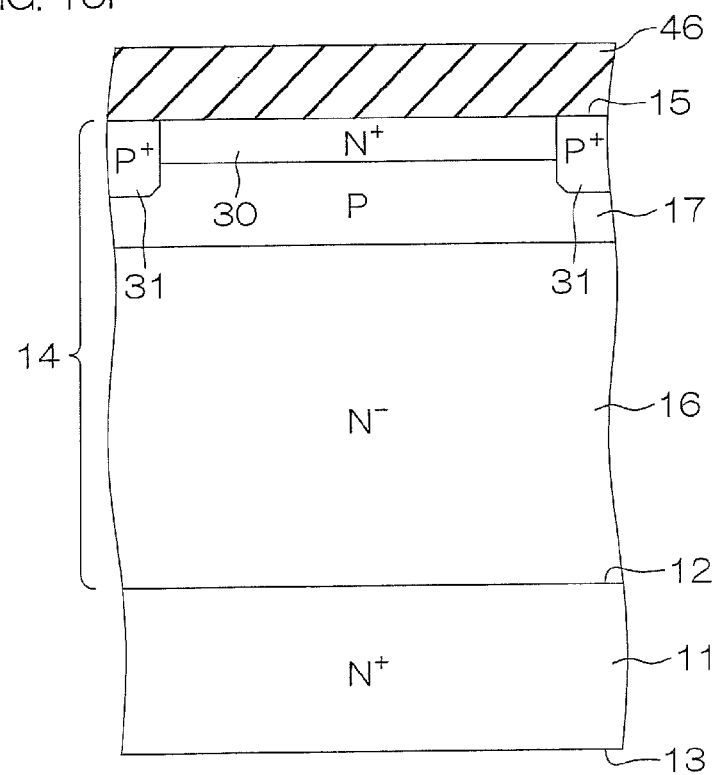
FIG. 10F is a diagram showing a step subsequent to FIG. 10E.
Figure 10G:
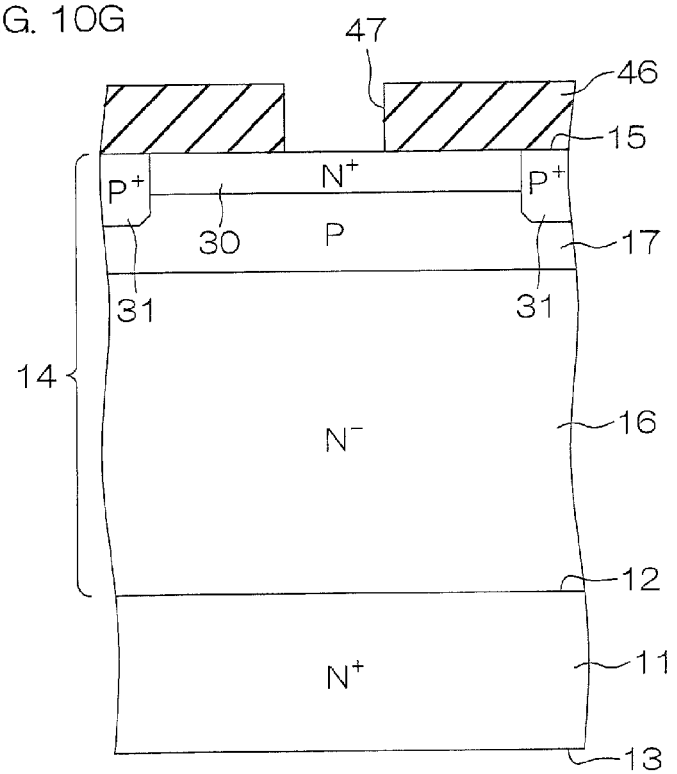
FIG. 10G is a diagram showing a step subsequent to FIG. 10F.
Figure 10H:
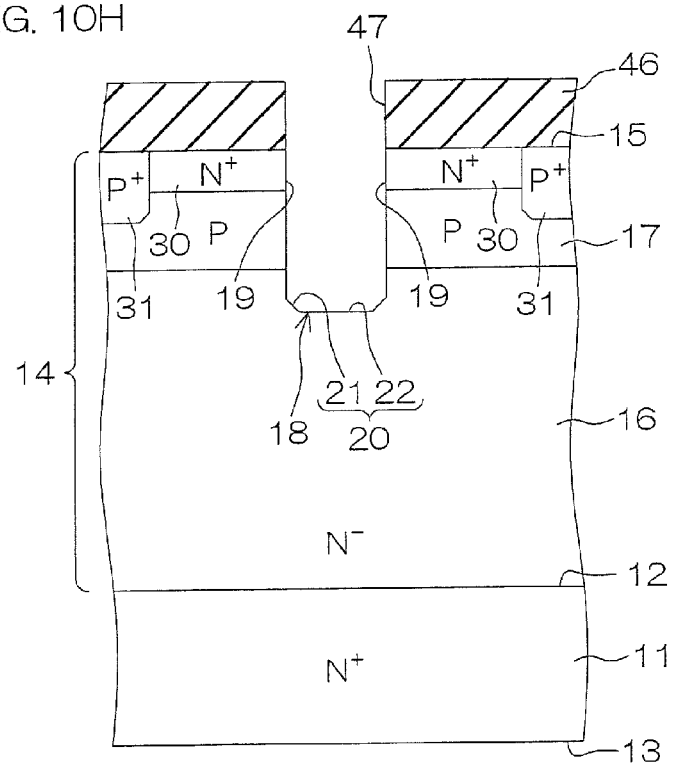
FIG. 10H is a diagram showing a step subsequent to FIG. 10G.
Figure 10:
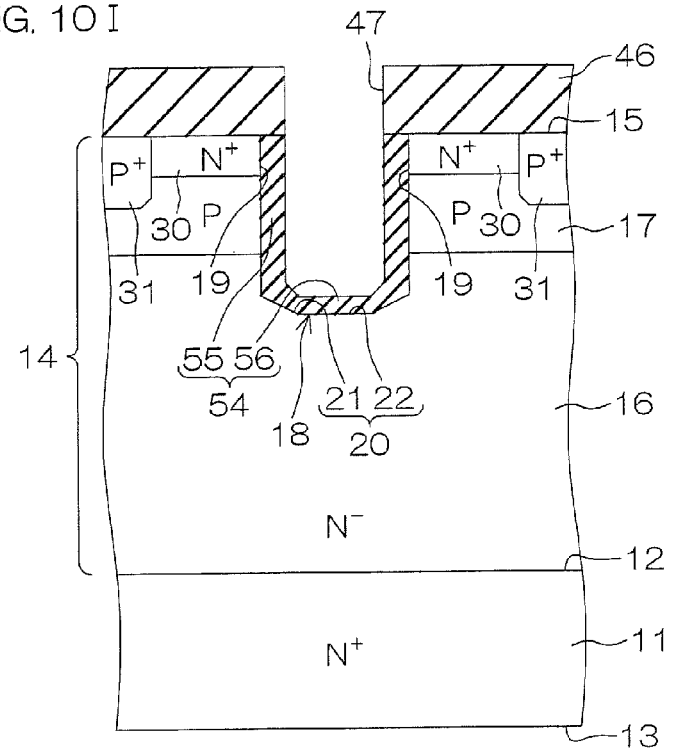
FIG. 10I is a diagram showing a step subsequent to FIG. 10H.
FIG. 10J is a diagram showing a step subsequent to FIG. 10I.
FIG. 10K is a diagram showing a step subsequent to FIG. 10J.
FIG. 10L is a diagram showing a step subsequent to FIG. 10K.
FIG. 10M is a diagram showing a step subsequent to FIG. 10L.
FIG. 10N is a diagram showing a step subsequent to FIG. 10M.
FIG. 10O is a diagram showing a step subsequent to FIG. 10N.
Figure 10:
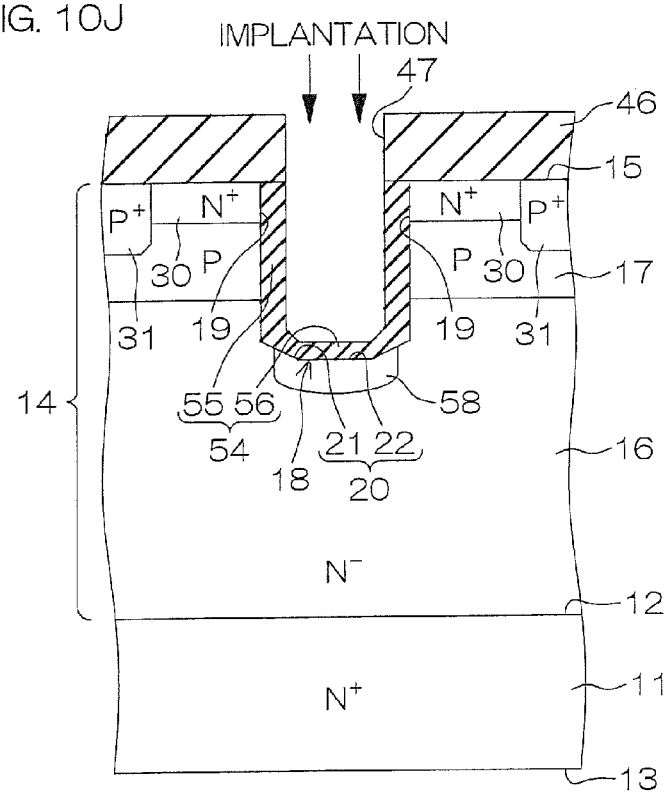

FIGS. 10A to 10O are schematic sectional views for illustrating the manufacturing method for the semiconductor device shown in FIG. 9.

First, steps similar to FIGS. 8A to 8H are carried out as shown in FIGS. 10A to 10H, and the gate trench 18 is formed in an epitaxial layer 14.

Then, the inner surfaces (side surfaces 19 and a bottom surface 20) of the gate trench 18 are oxidized by thermal oxidation (Dry oxidation) employing $O_2$ gas, as shown in FIG. 10I. The $O_2$ gas is supplied for a time longer than the supply time at the time of forming the stopper film 48 in the third embodiment, at 1200° C. for 3 hours to 5 hours, for example. The gate trench 18 is formed in the epitaxial layer 14 made of SiC, and hence the oxidation of the inner surfaces of the gate trench 18 progresses under the condition that the rate of oxidation of a parallel portion 22 which is an Si plane and the rate of oxidation of the side surfaces 19 which are planes orthogonal to the Si plane satisfy a relational expression: rate of oxidation of parallel portion 22/rate of oxidation of side surfaces 19=0.1 to 0.2<1, for example. Thus, a trench protective film 54 (a silicon oxide film) in which the thickness of a portion (a protective film bottom portion 56) on the bottom surface 20 (the parallel portion 22) is smaller than the thickness of portions (protective film side portions 55) on the side surfaces 19 is formed. The ratio (thickness of protective film bottom portion 56/thickness of protective film side portions 55) of the thickness of the protective film bottom portion 56 to the thickness of the protective film side portions 55 formed in such a manner is 0.1 to 0.2, for example. As to the specific sizes of the thicknesses, the thickness of the protective film side portions 55 is 0.1 µm to 0.5 µm, and the thickness of the protective film bottom portion 56 is 0.02 µm to 0.1 µm, for example.

Then, a P-type impurity is implanted from the bottom surface 20 of the gate trench 18 into the inner portion of the epitaxial layer 14 through the protective film bottom portion 56, as shown in FIG. 10J. While the implantation conditions at this time vary with the type of the P-type impurity, acceleration energy is 30 kEV to 180 kEV, for example. Thus, an implantation layer 58 is formed on a portion of the epitaxial layer 14 extending from the bottom surface 20 of the gate trench 18 to an intermediate portion in the thickness direction thereof.

Figure 10K:
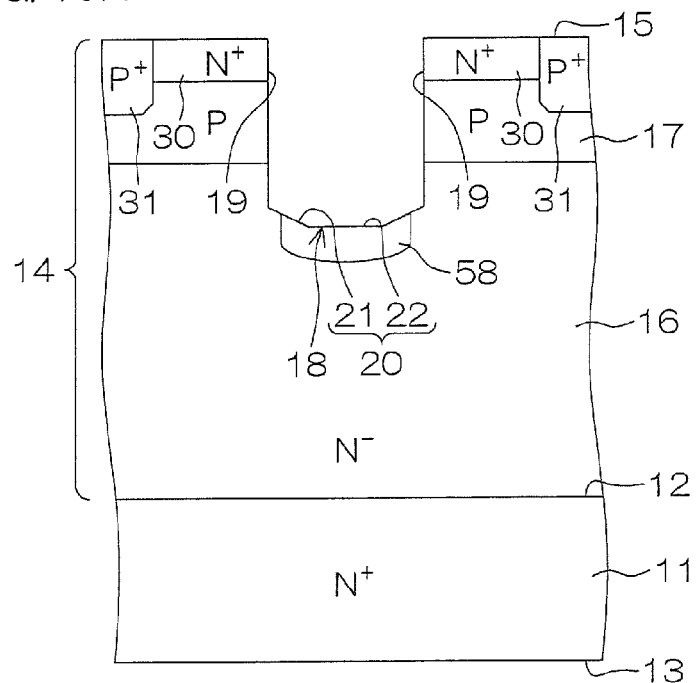
Figure 10L:
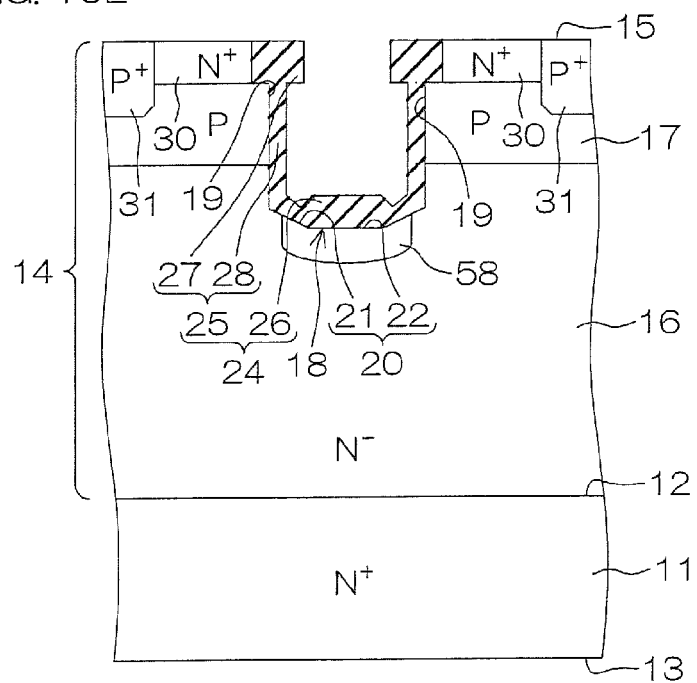
Figure 10M:
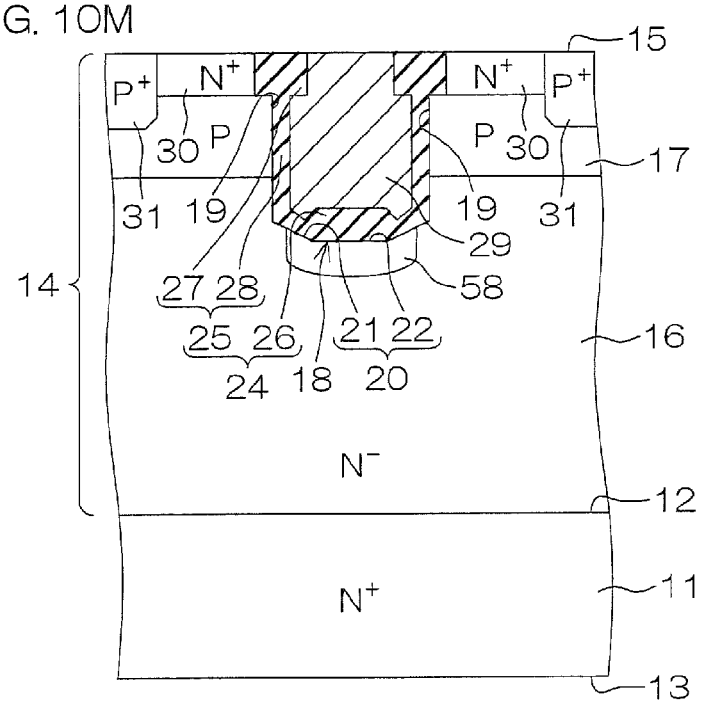
Figure 10N:
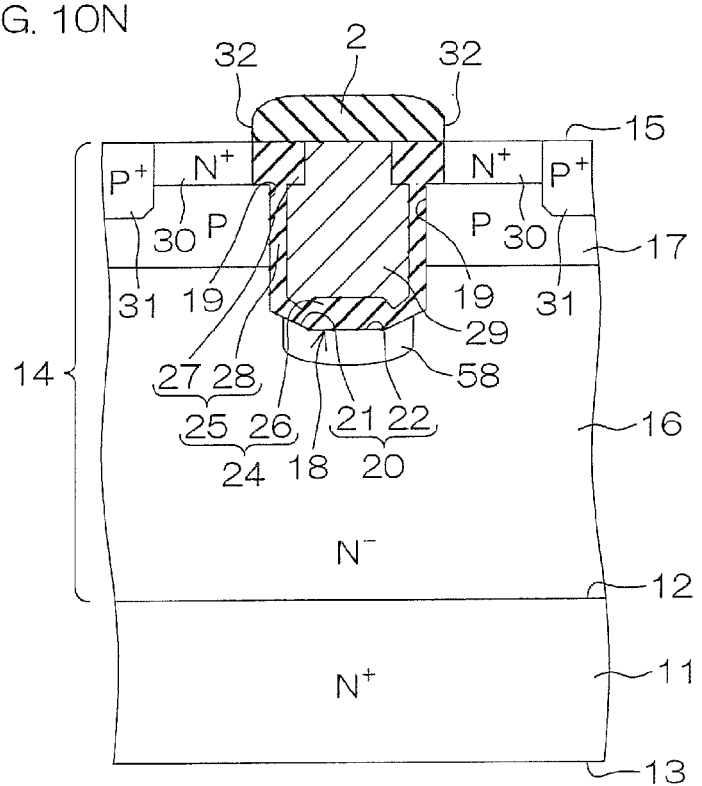
Figure 100:
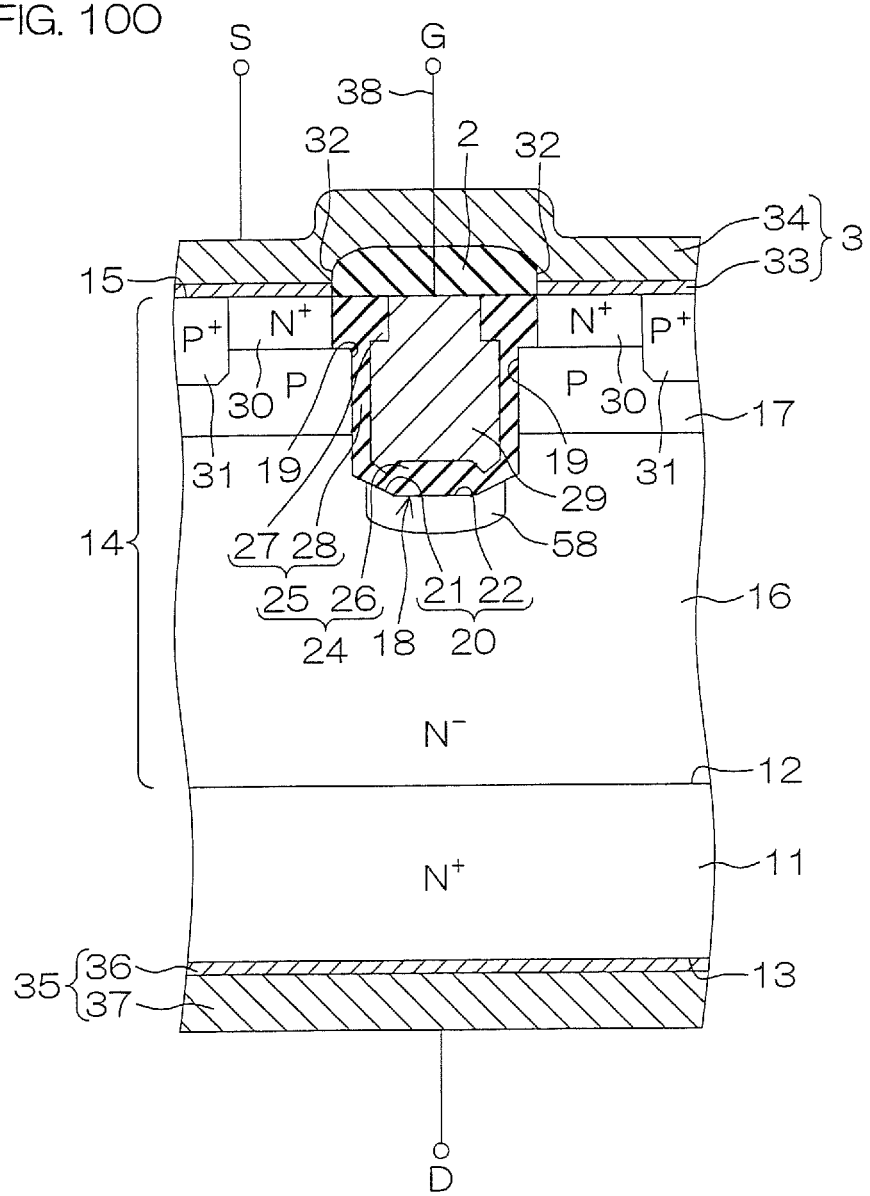

Then, a trench forming mask 46 made of SiO₂ and a trench protective film 54 are removed by wet etching, as shown in FIG. 10K.

Thereafter steps similar to FIGS. 8N to 8Q are carried out as shown in FIGS. 10L to 10O, and the semiconductor device 59 shown in FIG. 9 is obtained.

Thus, the bottom surface 20 of the gate trench 18 has the parallel portion 22 (the Si plane) parallel to a surface 15 (an Si plane) of the epitaxial layer 14. Therefore, the oxidation of the inner surfaces of the gate trench 18 before the formation of the implantation layer 52 progresses under the condition that the rate of oxidation of the parallel portion 22 and the rate of oxidation of the side surfaces 19 which are the planes orthogonal to the Si plane satisfy the relational expression: rate of oxidation of parallel portion 22/rate of oxidation of side surfaces 19=0.1 to 0.2<1, for example. Consequently, the trench protective film 54 in which the thickness of the portion (the protective film bottom portion 56) on the parallel portion 22 is smaller than the thickness of the portions (the protective film side portions 55) on the side surfaces 19 can be formed.

As to other functions and effects similar to those of the first and third embodiments, description is omitted.

While the embodiments of the present invention have been described, the present invention can be embodied in other ways.

For example, a structure obtained by inverting the conductivity types of the respective semiconductor portions of the semiconductor device 1, 53, 57 or 59 may be employed. In other words, the P-type portions may be of N-types and the N-type portions may be of P-types in the semiconductor device 1, 53, 57 or 59.

A structure in which the material for the trench forming mask 46 and the material for the trench protective mask 51 are inverted may be employed. In other words, the trench forming mask 46 may be made of polysilicon, and the trench protective mask 51 may be made of SiO₂.

Figure 11:
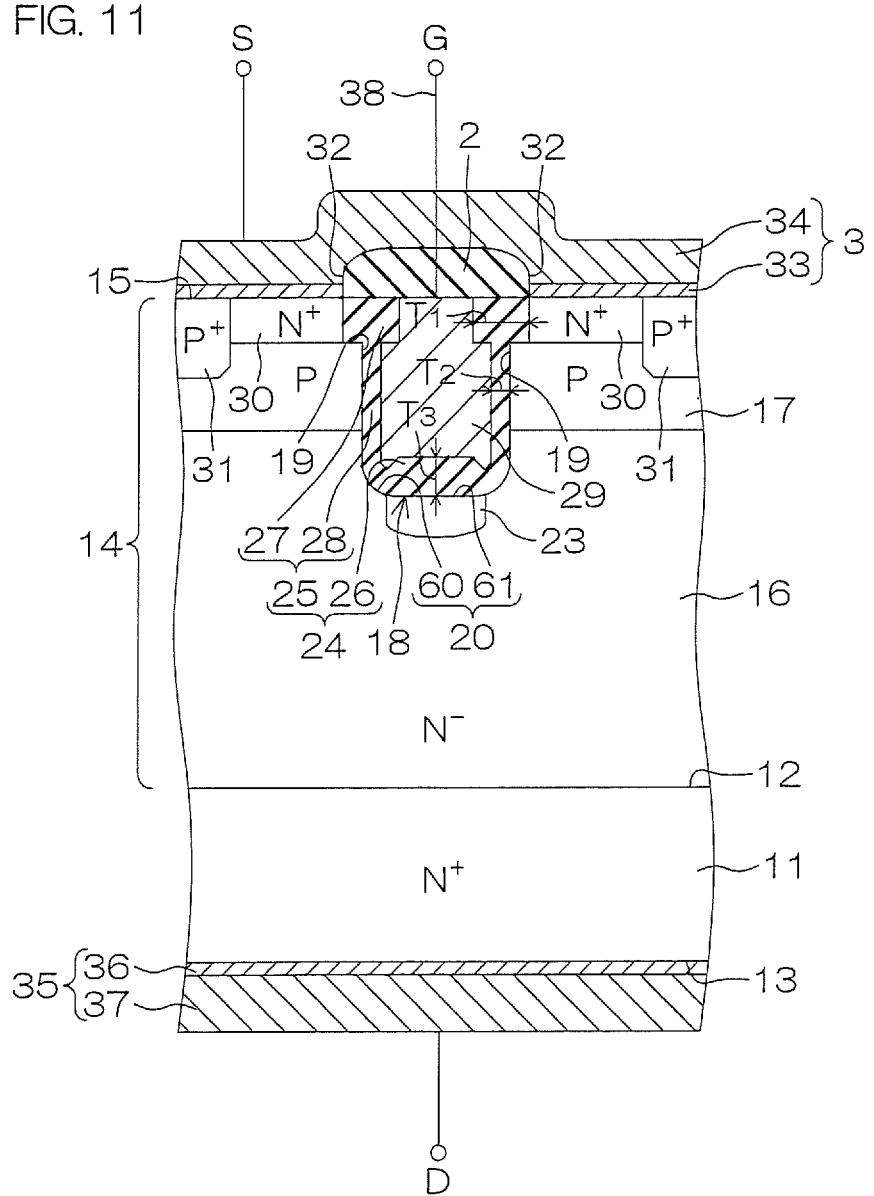
FIG. 11 is a schematic sectional view showing a modification of the semiconductor device according to the first embodiment of the present invention.
Figure 12:
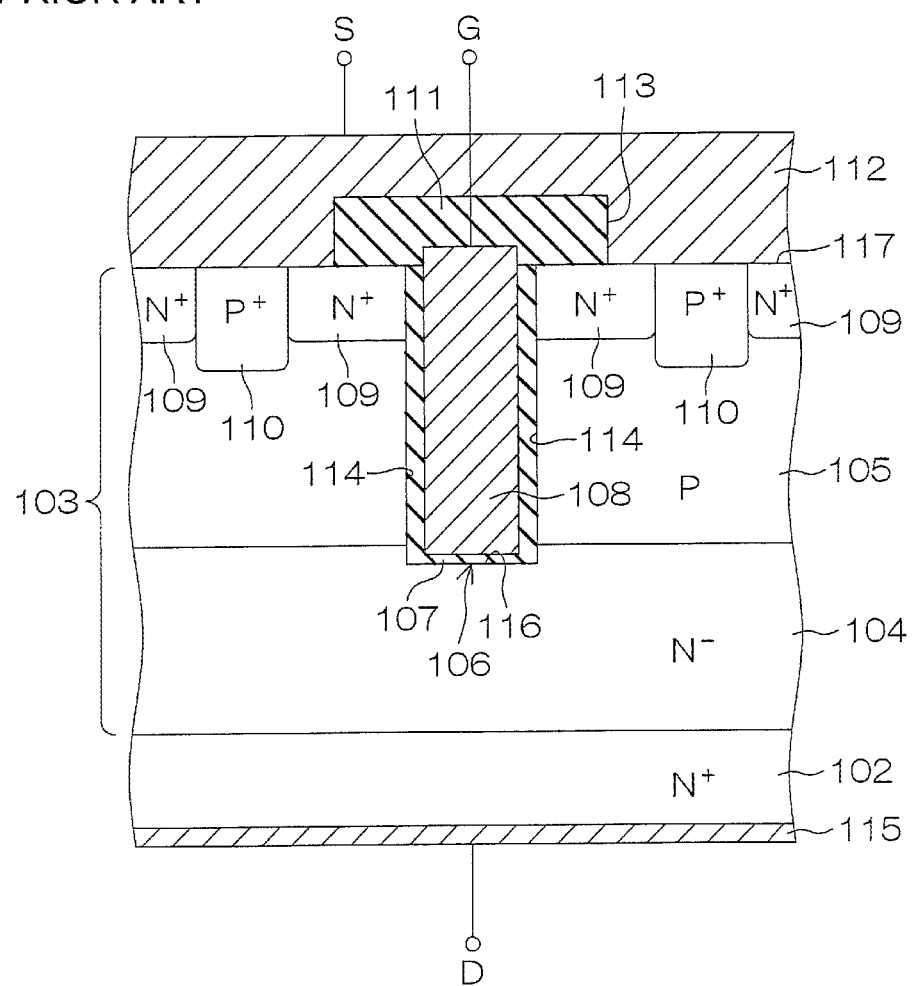
FIG. 12 is a schematic sectional view of a conventional SiC semiconductor device having a trench gate VDMOSFET.

The bottom surface 20 of the gate trench 18 may be in the form of an arc in sectional view having bent surfaces 60 bent toward the side of the drain region 16 on both end portions of the side surfaces 19 opposed to each other at an interval in the opposed direction and a parallel portion 61 connecting lower ends of the bent surfaces 60 with each other, as shown in FIG. 11. Such bent surfaces 60 can be formed along with the stopper film 48 by properly adjusting the condition of the thermal oxidation in the step shown in FIG. 4H, for example. Also with the arcuate bottom surface 20, electric field concentration on end portions of the bottom surface 20 of the gate trench 18 can be suppressed when the semiconductor device 1 is turned off, similarly to the case where the bottom surface 20 of the gate trench 18 has the inclined portions 21.

The surface 12 of the SiC substrate 11 may not necessarily be the Si plane, but may simply have such a surface orientation that oxidation progresses under the condition satisfying the relational expression: rate of oxidation of parallel portion 22/rate of oxidation of side surfaces 19=0.1 to 0.2<1 when the inner surfaces of the gate trench 18 are oxidized, for example.

The source electrode 3 and the drain electrode 35 may have multilayer structures of layers in which nickel (Ni) or titanium (Ti) is silicified and the aforementioned metal layers.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

The components shown in each embodiment of the present invention can be combined within the range of the present invention.

This application corresponds to Japanese Patent Application No. 2009-097336 filed with the Japan Patent Office on Apr. 13, 2009, the disclosure of which is incorporated herein by reference.

DESCRIPTION OF THE REFERENCE NUMERALS

1 . . . semiconductor device, 14 . . . epitaxial layer, 15 . . . surface (of epitaxial layer), 17 . . . body region, 18 . . . gate trench, 19 . . . side surface (of gate trench), 20 . . . bottom surface (of gate trench), 23 . . . implantation active layer, 24 . . . gate insulating film, 25 . . . insulating film side portion, 26 . . . insulating film bottom portion, 27 . . . source adjacent portion, 28 . . . body adjacent portion, 29 . . . gate electrode, 30 . . . source region, 39 . . . P-type implantation region, 45 . . . N⁺-type implantation region, 46 . . . trench forming mask, 51 . . . trench protective mask, 52 . . . implantation layer, 53 . . . semiconductor device, 54 . . . trench protective film, 57 . . . semiconductor device, 58 . . . implantation layer, 59 . . . semiconductor device, 60 . . . bent surface

The invention claimed is:

1. A semiconductor device comprising:
a semiconductor layer of a first conductivity type made of SiC;
a body region of a second conductivity type formed on a surface layer portion of the semiconductor layer;
a gate trench dug down from a surface of the semiconductor layer with a bottom surface formed on a portion of the semiconductor layer under the body region;
a plurality of source regions of the first conductivity type formed on a surface layer portion of the body region adjacent to side surfaces of the gate trench;
a gate insulating film formed on the bottom surface and side surfaces of the gate trench so that the thickness of a bottom portion on the bottom surface is greater than the thickness of side portions on the side surfaces;
a gate electrode embedded in the gate trench through the gate insulating film; and
an implantation layer formed on a portion of the semiconductor layer extending from the bottom surface of the gate trench to an intermediate portion of the semiconductor layer in the thickness direction by implantation of a second conductivity type impurity;
wherein side portions of the gate insulating film include at least one first portion adjacent to the plurality of source regions on the side surfaces of the gate trench and at least one second portion other than the at least one first portion thereof;
wherein a thickness $T_1$ of the first portions is greater than a thickness $T_2$ of the second portions;
wherein the first portions of the gate insulating film protrude along with the surface of the semiconductor layer on both of an inner side and an outer side of the gate trench with respect to the side surfaces of the gate trench inside the gate trench; and
wherein the ratio ($T_1/T_2$) of the thickness $T_1$ of the first portions of side portions to the thickness $T_2$ of the second portions thereof is greater than 1 and less than or equal to 3.

2. The semiconductor device according to claim 1, wherein the implantation layer is an active layer provided with conductivity by activation of the second conductivity type impurity.

3. The semiconductor device according to claim 1, wherein the ratio ($T_3/T_2$) of a thickness $T_3$ of the bottom portion of the gate insulating film to the thickness $T_2$ of the second portions of the side portions is 1 to 2.

4. The semiconductor device according to claim 1, wherein the surface of the semiconductor layer is an Si plane.

5. The semiconductor device according to claim 1, wherein the bottom surface of the gate trench includes inclined portions formed on both end portions of the side surfaces of the gate trench opposed to each other in the opposed direction and inclined from the respective lower ends of the side surfaces toward the surface of the semiconductor layer, and a parallel portion connecting lower ends of the inclined portions with each other and parallel to the surface of the semiconductor layer.

6. The semiconductor device according to claim 5, wherein the implantation layer is formed in contact with the whole area of the parallel portion.

7. The semiconductor device according to claim 1, wherein the depth of the implantation layer is 0.1 μm to 0.5 μm.

8. The semiconductor device according to claim 1, wherein the second conductivity type impurity concentration in the implantation layer is $1\times10^{16}$ cm$^{-3}$ to $1\times10^{21}$ cm$^{-3}$.

* * * * *